United States Patent

Satoshi et al.

[11] Patent Number: 6,136,502
[45] Date of Patent: Oct. 24, 2000

[54] RESIST COMPOSITION AND PATTERNING PROCESS

[75] Inventors: Watanabe Satoshi; Watanabe Osamu, both of Nakakubiki-gun; Furihata Tomoyoshi, Usui-gun; Takeda Yoshifumi, Nakakubiki-gun; Nagura Shigehiro, Nakakubiki-gun; Ishihara Toshinobu, Nakakubiki-gun; Yamaoka Tsuguo, Funabashi, all of Japan

[73] Assignee: Shin-Etsu Chemical Co., Ltd., Tokyo, Japan

[21] Appl. No.: 09/167,567

[22] Filed: Oct. 7, 1998

[30] Foreign Application Priority Data

Oct. 8, 1997 [JP] Japan ................................. 9-291681

[51] Int. Cl.$^7$ .................................................... G03F 7/004
[52] U.S. Cl. ...................... 430/270.1; 430/170; 430/326; 430/330; 430/905
[58] Field of Search ................................ 430/270.1, 905, 430/326, 170, 330

[56] References Cited

U.S. PATENT DOCUMENTS

| | | |
|---|---|---|
| 4,491,628 | 1/1985 | Ito et al. . |
| 4,603,101 | 7/1986 | Crivello . |
| 5,252,435 | 10/1993 | Tani et al. . |
| 5,310,619 | 5/1994 | Crivello et al. . |
| 5,324,804 | 6/1994 | Steinmann . |
| 5,714,559 | 2/1998 | Schacht et al. . |
| 5,942,367 | 8/1999 | Watanabe et al. ........................ 430/170 |

FOREIGN PATENT DOCUMENTS

| | | |
|---|---|---|
| 679 951 | 11/1995 | European Pat. Off. . |
| 718 316 | 6/1996 | European Pat. Off. . |
| 738 744 | 10/1996 | European Pat. Off. . |
| 780 732 | 6/1997 | European Pat. Off. . |
| 62-115440 | 5/1987 | Japan . |
| 63-27829 | 5/1988 | Japan . |
| 2-27660 | 6/1990 | Japan . |
| 3-223858 | 10/1991 | Japan . |
| 4-211258 | 8/1992 | Japan . |
| 6-100488 | 4/1994 | Japan . |
| 8-253534 | 10/1996 | Japan . |
| 8-305025 | 11/1996 | Japan . |

OTHER PUBLICATIONS

Patent Abstracts of Japan—Publication No. 08337616.
Derwent Publications Ltd.—XP–002090333.
Derwent Publications Ltd.—XP–002090334.

*Primary Examiner*—John S. Chu
*Attorney, Agent, or Firm*—Millen, White, Zelano & Branigan, P.C.

[57] ABSTRACT

A resist composition comprising (A) an organic solvent; (B) at least two polymers with weight average molecular weights of 1,000–500,000, which have at least one type of acid labile group and are crosslinked within a molecule and/or between molecules with crosslinking groups having C—O—C linkages; and (C) a photoacid generator is sensitive to high-energy radiation, has excellent sensitivity, resolution, and plasma etching resistance, and provides resist patterns of outstanding thermal stability and reproducibility. Patterns obtained with this resist composition are less prone to overhanging and have excellent dimensional controllability. The resist composition is suitable as a micropatterning material for VLSI fabrication because it has a low absorption at the exposure wavelength of a KrF excimer laser, thus enabling the easy formation of a finely defined pattern having sidewalls perpendicular to the substrate.

19 Claims, No Drawings

RESIST COMPOSITION AND PATTERNING PROCESS

BACKGROUND OF THE INVENTION

1. Field of the Invention

The present invention relates to a resist composition and a patterning process using the resist composition. The resist composition comprises, as the base resin, a combination of at least two polymers which contain at least one type of acid labile group and are crosslinked within a molecule and/or between molecules with crosslinking groups having C—O—C linkages. This resist composition provides a much improved alkali dissolution contrast before and after exposure, high sensitivity, and high resolution. In particular, it has an excellent reproducibility as a micropatterning material for VLSI fabrication.

2. Prior Art

Deep-ultraviolet lithography, one of a number of recent efforts that are being made to achieve a finer pattern rule in the drive for higher integration and operating speeds in LSI devices, is thought to hold particular promise as the next generation in microfabrication technology. Deep-UV lithography is capable of achieving a minimum feature size of 0.5 $\mu$m or less and, when a resist having low light absorption is used, can form patterns with sidewalls that are nearly perpendicular to the substrate.

Recently developed acid-catalyzed chemically amplified positive resists, such as those described in JP-B 27660/1990, JP-A 27829/1988, U.S. Pat. No. 4,491,628 and U.S. Pat. No. 5,310,619, utilize a high-intensity KrF excimer laser as the deep-UV light source. These resists, with their excellent properties such as high sensitivity, high resolution, and good dry etching resistance, are especially promising for deep-UV lithography.

Chemically amplified positive resists such as this include two-component systems comprising a base resin and a photoacid generator, and three-component systems comprising a base resin, a photoacid generator, and a dissolution regulator having acid labile groups.

For example, JP-A 115440/1987 describes a resist comprising poly-4-tert-butoxystyrene and a photoacid generator, and JP-A 223858/1991 describes a similar two-component resist comprising a resin bearing tert-butoxy groups within the molecule, in combination with a photoacid generator. JP-A 211258/1992 describes a two-component resist which is comprised of polyhydroxystyrene bearing methyl, isopropyl, tert-butyl, tetrahydropyranyl, and trimethylsilyl groups, together with a photoacid generator.

JP-A 100488/1994 discloses a resist comprised of a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator.

However, when the base resin in these resists bears acid labile groups on side chains and these acid labile groups are groups such as tert-butyl and tert-butoxycarbonyl which are cleaved by strong acids, the resin reacts with air-borne basic compounds and loses some of its activity, as a result of which cleavage of the acid labile groups arises less readily and the resist pattern tends to take on a T-top profile. By contrast, alkoxyalkyl groups such as ethoxyethyl are cleaved by weak acids, and so are little affected by air-borne basic compounds. Yet, their use also has its drawbacks, such as considerable narrowing of the pattern configuration as the time interval between exposure and heat treatment increases.

Moreover, the presence of bulky groups on the side chains lowers the thermal stability of the resin, making it impossible to achieve a satisfactory sensitivity and resolution. These problems have hitherto prevented the practical implementation of either approach, and workable solutions have been sought.

The polymers described in JP-A 305025/1996 represent an attempt to resolve the foregoing problems, but characteristics of the production process render difficult the design of substituent ratios for acid labile groups and crosslinking groups. An additional shortcoming is that the production of these compounds results in the incidental formation of the crosslinking groups mentioned in JP-A 253534/1996. That is, in the design of resist compositions, polymers having various alkali dissolution rates are required, depending on the types and amounts of photoacid generators and additives selected, in addition to which the production of these polymers must be a reproducible process. However, the production methods described in the above prior-art references are subject to inherent limitations in the selection of acid labile groups and crosslinking groups, and in their substituent ratios.

SUMMARY OF THE INVENTION

It is, therefore, an object of the present invention to provide a resist composition which has a higher sensitivity and resolution than prior-art resists, increased exposure latitude, process flexibility and reproducibility, and excellent plasma etching resistance, and which forms a resist pattern of outstanding thermal stability. Another object of the invention is to provide a patterning process which uses this resist composition.

We have found that resist compositions comprising, as the base resin, a combination of two or more polymers (prepared by the methods subsequently discussed) which contain at least one type of acid labile group, are crosslinked within a molecule and/or between molecules with crosslinking groups having C—O—C linkages, and have weight average molecular weights of from 1,000 to 500,000, and comprising also a photoacid generator provide resist films having an increased dissolution contrast, and that the further inclusion of a basic compound improves the slope of the dissolution contrast curve. Resist compositions in which there is additionally formulated an aromatic compound containing a ≡C—COOH group within the molecule increase the dissolution contrast of the resist film, and in particular speed up the dissolution rate following exposure, in addition to which they enhance the post-exposure delay (PED) stability of the resist composition and reduce edge roughness on a nitride film substrate. With the further formulation of an acetylene alcohol derivative, we have discovered that there can be obtained resist compositions which, owing to enhanced ease of application and shelf stability, high resolution, and excellent exposure latitude and process flexibility, have a high practical utility and can be used to good advantage in precise microfabrication, making them very effective as VLSI resists.

In particular, we have found that when a suitable combination of two or more of the polymers according to the invention is used, intramolecular and/or intermolecular crosslinking groups having C—O—C linkages and acid labile groups playing the important role in lithography can be easily introduced at will in accordance with a particular layer or substrate used in device fabrication, and polymers of differing molecular weights can be easily incorporated as desired in order to enhance the contrast and improve adhesion to the substrate, thereby enabling the fullest advantage to be taken of the desirable effects mentioned above. The resist composition may thus have other features added to it without compromising the high contrast provided by the polymers of the invention when used alone.

Based on these findings, the present invention provides a resist composition comprising:

(A) an organic solvent;

(B) at least two polymers which contain at least one type of acid labile group, are crosslinked within a molecule and/or between molecules with crosslinking groups having C—O—C linkages, and have weight average molecular weights of 1,000 to 500,000; and (C) a photoacid generator.

Preferably, the at least two polymers of component (B) differ with respect to weight average molecular weight, acid labile group content, crosslinking group content, type of acid labile group, or type of crosslinking group.

Further preferably, the at least two polymers of component (B) are selected from among polymers which contain recurring units of general formula (1) below and have weight average molecular weights of 1,000 to 500,000,

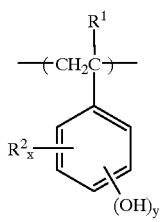

(1)

wherein $R^1$ is hydrogen or methyl; $R^2$ is a straight, branched, or cyclic alkyl of 1 to 8 carbon atoms; and x is 0 or a positive integer and y is a positive integer, satisfying $x+y \leq 5$;

in which the hydrogen atoms on some of the phenolic hydroxyl groups have been substituted with at least one type of acid labile group;

which are crosslinked within a molecule and/or between molecules with crosslinking groups having C—O—C linkages resulting from the reaction of some of the remaining phenolic hydroxyl groups with an alkenyl ether compound or a halogenated alkyl ether compound; and in which the combined amount of said acid labile groups and crosslinking groups averages more than 0 mol %, but not more than 80 mol %, of all the phenolic hydroxyl group hydrogens in formula (1).

More preferably, the at least two polymers of component (B) are selected from among polymers which contain recurring units of general formula (2) below and have weight average molecular weights of 1,000 to 500,000,

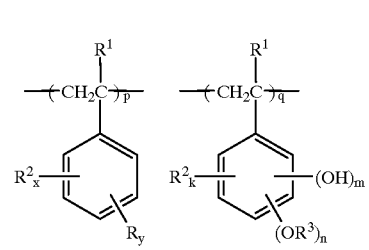

(2)

wherein R represents a hydroxyl group or an $OR^3$ group, at least one of the R groups being hydroxyl; $R^1$ is hydrogen or methyl; $R^2$ is a straight, branched, or cyclic alkyl of 1 to 8 carbon atoms; $R^3$ is an acid labile group; x is 0 or a positive integer and y is a positive integer, satisfying $x+y \leq 5$; k is 0 or a positive integer, m is 0 or a positive integer, and n is a positive integer, satisfying $k+m+n \leq 5$; p and q are positive numbers satisfying $p+q=1$; and when n is 2 or more, the $R^3$ groups may be the same or different;

which are crosslinked within a molecule and/or between molecules with crosslinking groups having C—O—C linkages resulting from the reaction of phenolic hydroxyl groups represented by R in formula (2) with an alkenyl ether compound or a halogenated alkyl ether compound; and in which the combined amount of said acid labile groups and crosslinking groups averages more than 0 mol %, but not more than 80 mol %, of all the phenolic hydroxyl group hydrogens in formula (1).

Further preferably, the at least two polymers of component (B) are selected from among polymers which contain recurring units of general formula (3) below and have weight average molecular weights of 1,000 to 500,000;

which are crosslinked within a molecule and/or between molecules by crosslinking groups having C—O—C linkages of general formula (4a) or (4b) below at oxygen atoms left after elimination of hydrogen atoms from the phenolic hydroxyl groups represented by R in formula (3); and in which the combined amount of said acid labile groups and crosslinking groups averages more than 0 mol %, but not more than 80 mol %, of all the phenolic hydroxyl group hydrogens in formula (1),

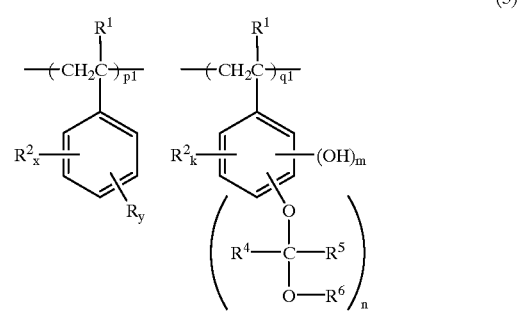

(3)

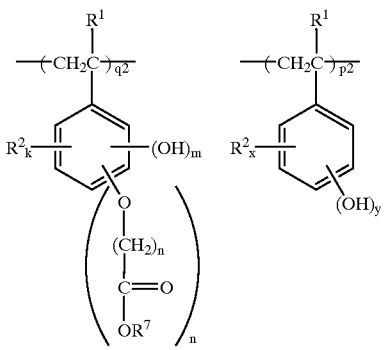

wherein R represents a hydroxyl group or an $OR^3$ group, at least one of the R groups being hydroxyl; $R^1$ is hydrogen or methyl; $R^2$ is a straight, branched, or cyclic alkyl of 1 to 8 carbon atoms; $R^3$ is an acid labile group; $R^4$ and $R^5$ are each hydrogen or a straight, branched, or cyclic alkyl of 1 to 8 carbon atoms; $R^6$ is a monovalent hydrocarbon group of 1 to 18 carbon atoms which may have a heteroatom; $R^4$ and $R^5$, $R^4$ and $R^6$, or $R^5$ and $R^6$ may together form a ring, with the proviso that $R^4$, $R^5$ and $R^6$ are each straight or branched alkylenes of 1 to 18 carbon atoms when they form a ring; $R^7$ is a tertiary alkyl of 4 to 20 carbon atoms, a trialkylsilyl group in which each of the alkyl constituents has 1 to 6 carbon atoms, an oxoalkyl group of 4 to 20 carbon atoms, or a group of the formula $—CR^4R^5OR^6$; p1 and p2 are positive numbers, and q1 and q2 are 0 or positive numbers, satisfying $0<p1/(p1+q1+q2+p2)\leq 0.8$, $0\leq q1/(p1+q1+q2+p2)\leq 0.8$, $0\leq q2/(p1+q1+q2+p2)\leq 0.8$, and $p1+q1+q2+p2=1$, provided that q1 and q2 are not both 0; the letter a is 0 or a positive integer from 1 to 6; and x, y, k, m and n are each as defined above;

(4a)

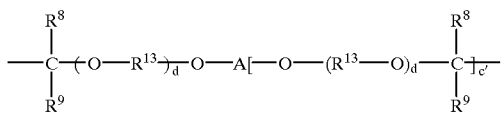

(4b)

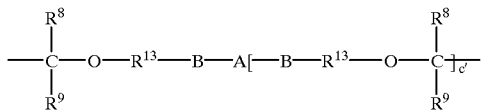

wherein $R^8$ and $R^9$ are each hydrogen or a straight, branched or cyclic alkyl of 1 to 8 carbon atoms, or $R^8$ and $R^9$ may together form a ring, with the proviso that each of $R^8$ and $R^9$ is a straight or branched alkylene of 1 to 8 carbon atoms when they form a ring; $R^{13}$ is a straight, branched or cyclic alkylene of 1 to 10 carbon atoms; the letter d is 0 or an integer from 1 to 10; A is a c-valent aliphatic or alicyclic saturated hydrocarbon, aromatic hydrocarbon, or heterocyclic group of 1 to 50 carbon atoms which may have an intervening heteroatom, and in which some of the hydrogen atoms attached to the carbon atoms may be substituted with hydroxyl, carboxyl, acyl, or halogen; B is —CO—O—, —NHCO—O—, or —NHCONH—; c is an integer from 2 to 8: and c' is an integer from 1 to 7.

The crosslinking groups having C—O—C linkages of general formula (4a) or (4b) are preferably represented by general formula (4a') or (4b') below.

(4a')

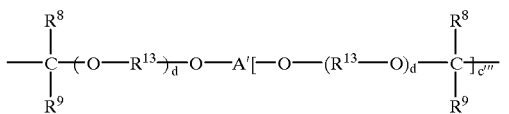

(4b')

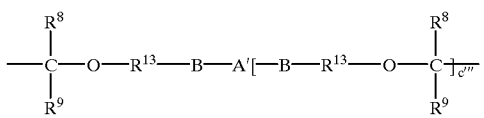

wherein $R^8$ and $R^9$ are each hydrogen or a straight, branched or cyclic alkyl of 1 to 8 carbon atoms, or $R^8$ and $R^9$ may together form a ring, with the proviso that each of $R^8$ and $R^9$ is a straight or branched alkylene of 1 to 8 carbon atoms when they form a ring; $R^{13}$ is a straight, branched or cyclic alkylene of 1 to 10 carbon atoms; the letter d is 0 or an integer from 1 to 5; A' is a c"-valent straight, branched, or cyclic alkylene, alkyltriyl, or alkyltetrayl of 1 to 20 carbon atoms, or an arylene of 6 to 30 carbon atoms, which may have an intervening heteroatom, and in which some of the hydrogen atoms attached to the carbon atoms may be substituted with hydroxyl, carboxyl, acyl or halogen; B is —CO—O—, —NHCO—O—, or —NHCONH—; c" is an integer from 2 to 4; and c''' is an integer from 1 to 3.

Component (C) is preferably at least one selected from among onium salts, diazomethane derivatives, glyoxime derivatives, and imidoyl sulfonate derivatives.

The resist composition may further comprise (D) a basic compound, preferably an aliphatic amine; (E) an aromatic compound having a $\equiv C—COOH$ group within the molecule; (F) another base resin; (G) a dissolution regulator; (H) a UV absorber; and/or (I) an acetylene alcohol derivative.

Component (F) is a base resin other than component (B). It is a partially substituted polymer containing recurring units of general formula (1) below and having a weight average molecular weight of 3,000 to 300,000, wherein an average of at least 0 mol %, but not more than 80 mol %, of all the hydrogen atoms on the phenolic hydroxyl groups have been substituted with at least one type of acid labile group, (1)

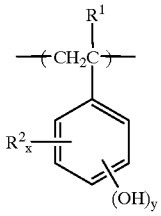

wherein $R^1$ is hydrogen or methyl; $R^2$ is a straight, branched, or cyclic alkyl of 1 to 8 carbon atoms; and x is 0 or a positive integer and y is a positive integer, satisfying $x+y\leq 5$.

More preferably, component (F) is a polymer containing recurring units of general formula (10) below and having a weight average molecular weight of 3,000 to 300,000

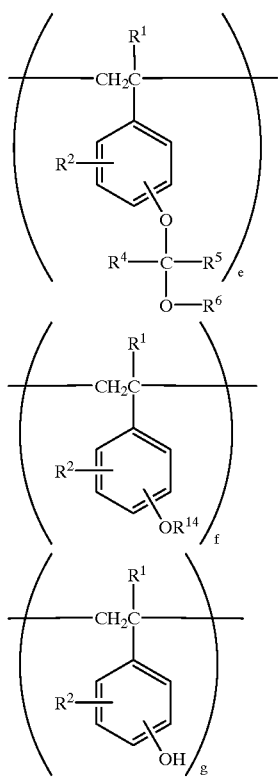

(10)

wherein $R^1$, $R^2$, $R^4$, $R^5$, and $R^6$ are as defined above; $R^{14}$ is an acid labile group other than —$CR^4R^5OR^6$; and e and f are each 0 or a positive number, and g is a positive number, satisfying $e+f+g=1$, $0 \leq e/(e+f+g) \leq 0.5$, and $0.4 \leq g/(e+f+g) \leq 0.9$ In a second aspect, the invention provides a patterning process comprising the steps of:

(i) applying the resist composition of claim 1 onto a substrate;

(ii) heat treating the applied resist composition, then exposing it through a photomask to high-energy radiation having a wavelength not greater than 300 nm or an electron beam; and (iii) heat treating the exposed resist composition if necessary, then developing it with a developer.

When the above-described polymers are formulated into the resist composition as the base resin, the resist composition is given the advantages of good dissolution inhibiting properties and a high dissolution contrast following exposure because the polymers are crosslinked with crosslinking groups having C—O—C linkages.

More particularly, in the case of a polymer in which alkoxyalkyl groups alone have been added to the side chains, a T-top profile does not readily arise because the elimination reaction proceeds in weak acid. However, since the polymer is very sensitive to acids as noted above, the pattern configuration narrows dramatically with the lapse of time between exposure and heat treatment. Moreover, because of low alkali dissolution inhibiting effects, a highly substituted polymer must be used to achieve an acceptable dissolution contrast, but this results in a poor thermal stability. On the other hand, when a polymer in which phenolic hydroxyl groups on side chains are protected with tert-butoxycarbonyl groups is included in the resist composition, the alkali dissolution inhibiting effects improve, as a result of which dissolution contrast is achieved at a low substitution ratio and the thermal stability is good. However, deprotection to render the polymer alkali soluble requires a photoacid generator which generates a strong acid such as trifluoromethanesulfonic acid. Unfortunately, the use of such a strong acid tends to result in the T-top profile mentioned earlier.

As opposed to the above-described two types of polymers, resist compositions using polymers which are crosslinked within a molecule and/or between molecules with crosslinking groups having C—O—C linkages and resulting from the reaction of some of the phenolic hydroxyl groups with an alkenyl ether compound or a halogenated alkyl ether compound provide a solution to both the low heat resistance of the polymers having side chains protected with acetal groups as well as the tendency of the polymers protected with tert-butoxycarbonyl groups to form a T-top profile.

The effect of the polymers used in the resist compositions according to this invention is described. Since the polymers according to the invention are crosslinked with crosslinking groups having acid labile C—O—C linkages and are protected with acid labile groups, they do not change their weight average molecular weight and their solubility in an alkali developer in the unexposed areas of the resist film. However, in the exposed areas of the resist film, the weight average molecular weight, owing to cleavage by the generated acid and elimination of the acid labile groups, returns to the weight average molecular weight of the alkali-soluble base resin prior to protection with the crosslinking groups and the acid labile groups. Accordingly, the alkali dissolution rate in the exposed areas becomes much higher than in the unexposed areas, thereby increasing the dissolution contrast, and in turn providing a higher resolution.

Moreover, when the crosslinking groups having C—O—C linkages are cleaved by the acid, alcohol compounds (e.g., diol, triol, and polyol compounds) form. The hydrophilic groups of the alcohol compounds increase the affinity of the resist to the alkali developer, which also helps to achieve a higher resolution.

Polymers having various alkali dissolution rates are required in the design of resist compositions, depending on the identity and amount of photoacid generator and additives used therein. In addition, reproducibility is called for in the production of these polymers. Use of the above-described polymers enables resist compositions to be designed without being subject to any limitations in the selection of the acid labile groups and crosslinking groups, and in the degree of substitution.

Compared with prior-art resists, a resist composition in which the above-described polymers are used as the base resin is much less likely to result in the formation of T-tops, narrowing of the pattern configuration, or insufficient thermal stability, and the dissolution contrast of the resist film can be increased. Hence, this resist composition has a high sensitivity and high resolution, in addition to which the pattern dimensions and pattern configuration can be freely controlled by the composition of the resist, thus giving excellent process flexibility and reproducibility.

In particular, when a combination of at least two polymers which differ with respect to weight average molecular weight, acid labile group content, crosslinking group content, type of acid labile group, or type of crosslinking group is used as the base resin of this invention, in the design of contrasting resist compositions which either emphasizes remaining patterns such as isolated lines and dot patterns, or emphasizes removal patterns such as dense patterns (as typified by lines and spaces) and contact holes, it is possible to meet either set of conflicting requirements without compromising the advantageous features of the resist composition.

Moreover, a low-molecular-weight resin that has been crosslinked with acid labile groups can easily be included as desired in the resist composition of the invention in order to enhance the dissolution rate of the exposed areas without lowering the thermal stability; that is, to improve contrast. The adhesion of the inventive resist composition to the substrate can also be improved.

DETAILED DESCRIPTION OF THE INVENTION

Polymers

The polymers used in the novel resist composition of the invention are high molecular compounds which contain at least one type of acid labile group, are crosslinked within a molecule and/or between molecules with crosslinking groups having C—O—C linkages, and have weight average molecular weights of from 1,000 to 500,000.

These polymers may be selected from among polymers which contain recurring units of general formula (1) below, in which the hydrogen atoms on some of the phenolic hydroxyl groups have been substituted with acid labile groups, and which are crosslinked within a molecule and/or between molecules with crosslinking groups having C—O—C linkages resulting from the reaction of some of the remaining phenolic hydroxyl groups with an alkenyl ether compound or a halogenated alkyl ether compound.

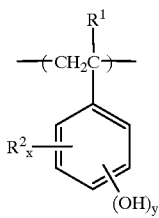

(1)

In the formula, $R^1$ is hydrogen or methyl; and $R^2$ is a straight, branched, or cyclic alkyl of 1 to 8 carbon atoms, preferably 1 to 5 carbon atoms, and more preferably 1 to 3 carbon atoms. Suitable examples of the straight, branched, or cyclic alkyl include methyl, ethyl, propyl, isopropyl, n-butyl, isobutyl, tert-butyl, cyclohexyl, and cyclopentyl. Also, the letter x is 0 or a positive integer and y is a positive integer, satisfying the expression $x+y \leq 5$, with y preferably being 1 to 3, and more preferably 1 or 2.

The polymers of the invention may be selected from among polymers which contain recurring units of general formula (2) below, and are crosslinked within a molecule and/or between molecules with crosslinking groups having C—O—C linkages resulting from the reaction of some of the phenolic hydroxyl groups represented by R in formula (2) with an alkenyl ether compound or a halogenated alkyl ether compound.

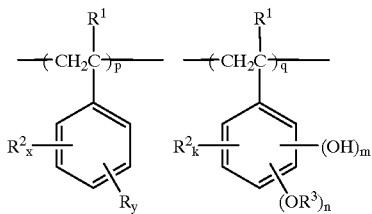

(2)

In formula (2), R represents a hydroxyl group or an $OR^3$ group, at least one of the R groups being hydroxyl; $R^1$ is hydrogen or methyl; $R^2$ is a straight, branched, or cyclic alkyl of 1 to 8 carbon atoms; and $R^3$ is an acid labile group. In addition, the letter x is 0 or a positive integer and y is a positive integer, satisfying $x+y \leq 5$; k is 0 or a positive integer, m is 0 or a positive integer, and n is a positive integer, satisfying $k+m+n \leq 5$; p and q are both positive numbers satisfying $p+q \leq 1$; and the $R^3$ groups may be the same or different when n is 2 or more.

The same examples of $R^1$ and $R^2$ and the same preferred range in y as noted above with reference to formula (1) apply here as well. The letter n is preferably 1 or 2, and the letter m is preferably 0 or 1.

Various groups may be selected as the acid labile groups which replace the hydrogens on the phenolic hydroxyl groups, or the acid labile groups represented by $R^3$. Examples include the groups having formulas (5) or (6) below, tertiary alkyl groups of 4 to 20 carbon atoms, trialkylsilyl groups in which each of the alkyls has 1 to 6 carbon atoms, and oxoalkyl groups of 4 to 20 carbon atoms.

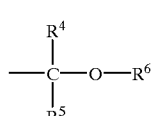

(5)

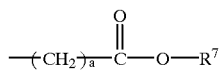

(6)

In these formulas, $R^4$ and $R^5$ are each hydrogen or a straight, branched or cyclic alkyl having 1 to 8 carbon atoms, preferably 1 to 6 carbon atoms, and more preferably 1 to 5 carbon atoms; and $R^6$ is a monovalent hydrocarbon group of 1 to 18 carbon atoms, preferably 1 to 10 carbon atoms, and more preferably 1 to 8 carbon atoms, which may contain a heteroatom. $R^4$ and $R^5$, $R^4$ and $R^6$, or $R^5$ and $R^6$ may together form a ring, with the proviso that $R^4$, $R^5$, and $R^6$ are each a straight or branched alkylene of 1 to 18 carbon atoms, preferably 1 to 10 carbon atoms, and more preferably 1 to 8 carbon atoms, when they form a ring. Also, $R^7$ is a tertiary alkyl group of 4 to 20 carbon atoms, preferably 4 to 15 carbon atoms, and more preferably 4 to 10 carbon atoms; a trialkysilyl group in which each of the alkyls has 1 to 6 carbon atoms, and preferably 1 to 4 carbon atoms; an oxoalkyl group of 4 to 20 carbon atoms, preferably 4 to 15 carbon atoms, and more preferably 4 to 10 carbon atoms; or a group of the formula —$CR^4R^5OR^6$; and the letter a is an integer from 0 to 6.

Examples of the straight, branched or cyclic alkyls having 1 to 8 carbon atoms represented by $R^4$ and $R^5$ are the same as given above for $R^2$.

Suitable examples of $R^6$ include straight, branched, or cyclic alkyls; substituted or unsubstituted aryls such as phenyl, p-methylphenyl, p-ethylphenyl, and alkoxy-substituted phenyls (e.g., p-methoxyphenyl); aralkyls such as benzyl and phenethyl; and alkyls of the formulas given below in which an oxygen atom intervenes, a hydrogen atom attached to a carbon atom is replaced by a hydroxyl group, or two hydrogen atoms are replaced by an oxygen atom to form a carbonyl group.

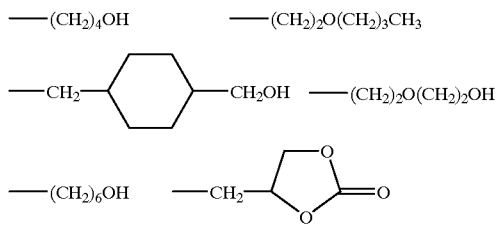

Suitable examples of tertiary alkyl groups of 4 to 20 carbon atoms represented by $R^7$ include tert-butyl, 1-methylcyclohexyl, 2-(2-methyl)adamantyl, and tert-amyl.

Examples of trialkylsilyl groups in which each of the alkyls has 1 to 6 carbon atoms represented by $R^7$ include trimethylsilyl, triethylsilyl, and dimethyl-tert-butylsilyl. Examples of oxoalkyl groups of 4 to 20 carbon atoms represented by $R^7$ include 3-oxoalkyl groups and the groups having the formulas given below.

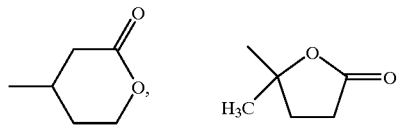

Illustrative examples of acid labile groups represented by formula (5) above include straight or branched acetal groups such as 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetal groups such as tetrahydrofuranyl and tetrahydropyranyl. Of these, ethoxyethyl, butoxyethyl and ethoxypropyl are preferred. Illustrative examples of acid labile groups represented by formula (6) above include tert-butoxycarbonyl, tert-butoxycarbonylmethyl, tert-amyloxycarbonyl, tert-amyloxycarbonylmethyl, 1-ethoxy-ethoxycarbonylmethyl, 2-tetrahydropyranyloxycarbonylmethyl, and 2-tetrahydrofuranyloxycarbonylmethyl. The same groups mentioned above with reference to $R^7$ are suitable here also as examples of the tertiary alkyls of 4 to 20 carbon atoms, trialkylsilyl groups in which each of the alkyls has 1 to 6 carbon atoms, or oxoalkyl groups of 4 to 20 carbon atoms which may serve as the acid labile group.

Examples of the aforementioned crosslinking groups having a C—O—C linkage include groups of general formula (4a) or (4b) below, and preferably of general formula (4a') or (4b').

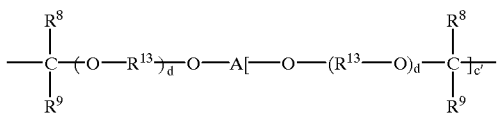

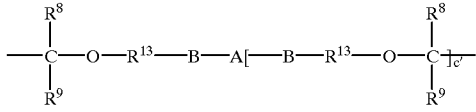

In formulas (4a) and (4b), $R^8$ and $R^9$ are each hydrogen or a straight, branched, or cyclic alkyl of 1 to 8 carbon atoms, and may together form a ring, with the proviso that each of $R^8$ and $R^9$ is a straight or branched alkylene of 1 to 8 carbon atoms when they form a ring; $R^{13}$ is a straight, branched or cyclic alkylene of 1 to 10 carbon atoms; the letter d is 0 or an integer from 1 to 10; A is a c-valent aliphatic or alicyclic saturated hydrocarbon group, aromatic hydrocarbon group, or heterocyclic group of 1 to 50 carbon atoms which may have an intervening heteroatom, and in which some of the hydrogen atoms attached to the carbon atoms may be substituted with hydroxyl, carboxyl, acyl, or halogen; B is —CO—O—, —NHCO—O—, or —NHCONH—; the letter c is an integer from 2 to 8, and c' is an integer from 1 to 7.

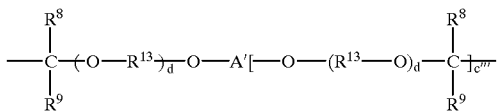

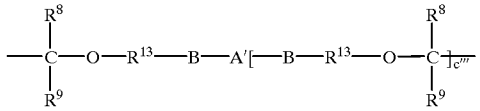

In formulas (4a') and (4b'), $R^8$ and $R^9$ are each hydrogen or a straight, branched or cyclic alkyl of 1 to 8 carbon atoms, and may together form a ring, with the proviso that each of $R^8$ and $R^9$ is a straight or branched alkylene of 1 to 8 carbon atoms when they form a ring; $R^{13}$ is a straight, branched or cyclic alkylene of 1 to 10 carbon atoms; d is 0 or a positive integer from 1 to 5; A' is a c"-valent straight, branched, or cyclic alkylene, alkyltriyl, or alkyltetrayl of 1 to 20 carbon atoms, or an arylene of 6 to 30 carbon atoms, any of which may have an intervening heteroatom, and in which some of the hydrogen atoms attached to the carbon atoms may be substituted with hydroxyl, carboxyl, acyl or halogen; B is —CO—O—, —NHCO—O—, or —NHCONH—; c" is an integer from 2 to 4; and c''' is an integer from 1 to 3.

Examples of the straight, branched or cyclic alkyl of 1 to 8 carbon atoms represented by $R^8$ and $R^9$ are as mentioned earlier. Examples of the straight, branched or cyclic alkylene of 1 to 8 carbon atoms represented by $R^{13}$ include methylene, ethylene, propylene, isopropylene, n-butylene, isobutylene, cyclohexylene, and cyclopentylene. Examples of A are given later. These crosslinking groups (4a) and (4b) are derived from alkenyl ether compounds and halogenated alkyl ether compounds to be described later.

As is apparent from the value of c' in above formulas (4a) and (4b), the crosslinking groups are not limited to divalent groups, and may also be groups having a valence of 3 to 8. Examples of divalent crosslinking groups include those of formulas (4a") and (4b") below, and examples of trivalent crosslinking groups include those of formulas (4a'") and (4b'") below.

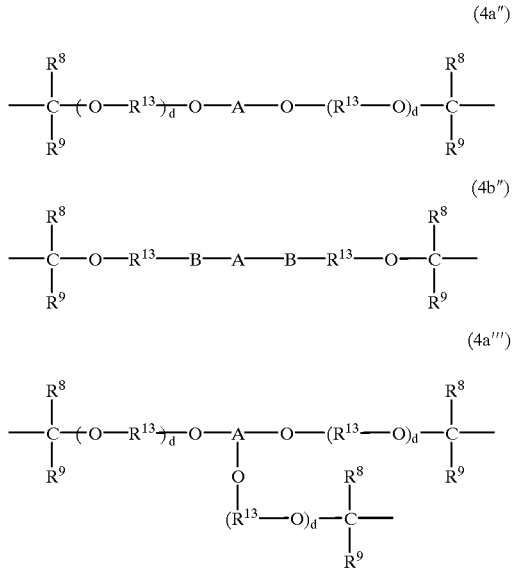

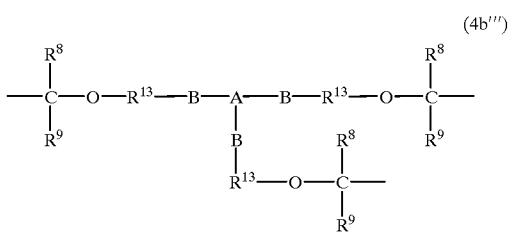

Illustrative examples of polymers according to the invention include polymers which have recurring groups and are crosslinked within a molecule and/or between molecules by crosslinking groups having C—O—C linkages of general formula (4a) or (4b) above at oxygen atoms from which hydrogen atoms on the phenolic hydroxyl groups represented by R in general formula (3) below have been removed.

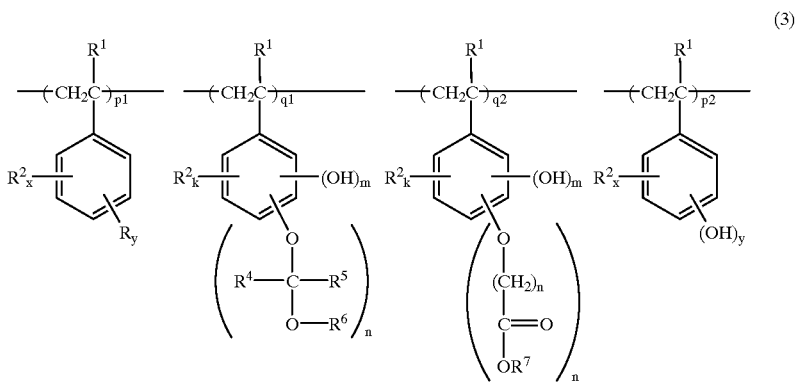

In the formula, R is a hydroxyl group or an $OR^3$ group, at least one of the R groups being hydroxyl; $R^1$ is hydrogen or methyl; $R^2$ is a straight, branched, or cyclic alkyl of 1 to 8 carbon atoms; $R^3$ is an acid labile group; $R^4$ and $R^5$ are each hydrogen or a straight, branched, or cyclic alkyl of 1 to 8 carbon atoms; $R^6$ is a monovalent hydrocarbon group of 1 to 18 carbon atoms which may have a heteroatom; $R^4$ and $R^5$, $R^4$ and $R^6$, or $R^5$ and $R^6$ may together form a ring, with the proviso that if they form a ring, $R^4$, $R^5$ and $R^6$ are each a straight or branched alkylene of 1 to 18 carbon atoms; $R^7$ is a tertiary alkyl of 4 to 20 carbon atoms, a trialkylsilyl group in which each of the alkyls has 1 to 6 carbon atoms, an oxoalkyl group of 4 to 20 carbon atoms, or a group of the formula —$CR^4R^5OR^6$; p1 and p2 are positive numbers and q1 and q2 are 0 or positive numbers, satisfying $0 \leq p1/(p1+q1+q2+p2) \leq 0.8$, $0 \leq q1/(p1+q1+q2+p2) \leq 0.8$, $0 \leq q2/(p1+q1+q2+p2)<0.8$, and $p1+q1+q2+p2=1$, provided that q1 and q2 are not both 0; the letter a is 0 or a positive integer from 1 to 6; x, y, k, m, and n are each as defined above; and $p1+p2=p$ and $q1+q2=q$.

Illustrative examples and preferred ranges for R, $R^1$ to $R^7$, x, y, k, m, n, and a here are the same as those mentioned above.

Letters p1 and p2 are positive numbers and q1 and q2 are 0 or positive numbers, satisfying $0 \leq p1/(p1+q1+q2+p2) \leq 0.8$, $0 < q1/(p1+q1+q2+p2) < 0.8$, $0 < q2/(p1+q1+q2+p2) \leq 0.8$, and $p1+q1+q2+p2=1$, provided that q1 and q2 are not both 0. Preferred values for p1, p2, q1, and q2 are given below.

$$0 < \frac{p1}{p1+q1+p2+q2} \leq 0.4,$$

and especially $$0.002 \leq \frac{p1}{p1+q1+p2+q2} \leq 0.2$$

$$0 \leq \frac{q1}{p1+q1+p2+q2} \leq 0.6,$$

and especially $$0 \leq \frac{q1}{p1+q1+p2+q2} \leq 0.4$$

$$0 \leq \frac{q2}{p1+q1+p2+q2} \leq 0.6,$$

and especially $$0 \leq \frac{q2}{p1+q1+p2+q2} \leq 0.4$$

$$0.4 < \frac{p2}{p1+q1+p2+q2} < 1,$$

and especially $$0.5 \leq \frac{p2}{p1+q1+p2+q2} \leq 0.9$$

$$0 < \frac{q1+q2}{p1+q1+p2+q2} \leq 0.6,$$

and especially $$0.1 \leq \frac{q1+q2}{p1+q1+p2+q2} \leq 0.4$$

Also, q1/(q1+q2) is preferably 0 to 1, more preferably 0.5 to 1, and most preferably 0.7 to 1.

Illustrative examples of these polymers include the compounds having formulas (3'-1) and (3'-2) below.

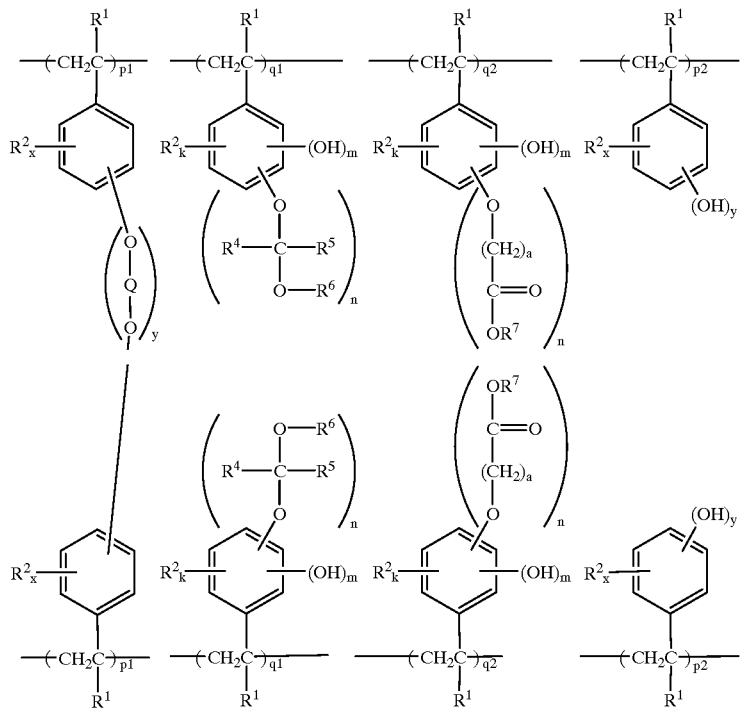

(3'-1)

-continued

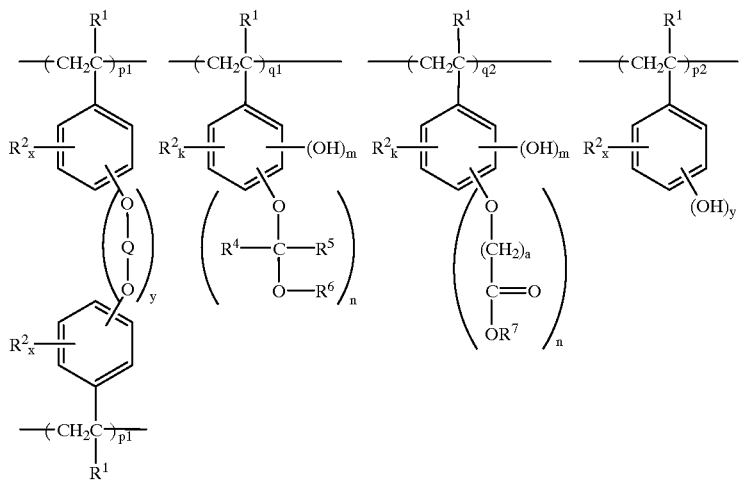

(3'-2)

Formula (3'-1) shows an intermolecular linkage, and formula (3'-2) shows an intramolecular linkage. These bonded states may exist either independently or in admixture.

In the above formulas, Q is a crosslinking group having a C—O—C linkage, typically a crosslinking group of formula (4a) or (4b) above, especially a crosslinking group of formula (4a"), (4b"), (4a'"), or (4b'"), and most preferably formula (4a') or (4b'). In cases where the crosslinking group has a valence of 3 or more, Q in above formula (3) is attached to three or more of the following units (1).

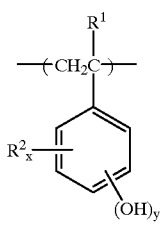

(1)

The polymers of the present invention are compounds in which the hydrogen atoms on some of the phenolic hydroxyl groups have been replaced with acid labile groups and the above-described crosslinking groups having C—O—C linkages. Preferably, the combined amount of acid labile groups and crosslinking groups averages more than 0 mol %, but not more than 80 mol %, and especially from 2 to 50 mol %, of all the hydrogen atoms on the phenolic hydroxyl groups of the compound of formula (1).

In this case, the amount of the crosslinking groups having C—O—C linkages averages more than 0 mol %, but not more than 80 mol %, and preferably from 0.2 to 20 mol %. If this is 0 mol %, the alkali dissolution rate contrast becomes too small, no advantage can be gained from the crosslinking groups, and an inferior resolution results. On the other hand, if this is more than 80 mol %, crosslinking proceeds too far, resulting in gelation and a loss of alkali solubility; during alkali development, changes occur in the film thickness, and internal stresses and bubble formation arise within the film; and adhesion to the substrate worsens owing to the paucity of hydrophilic groups.

The amount of the acid labile groups also averages more than 0 mol %, but not more than 80 mol %, and preferably from 10 to 50 mol %. If this is 0 mol %, the alkali dissolution rate contrast becomes too small and the resolution worsens. On the other hand, an amount greater than 80 mol % results in a loss in alkali solubility, a lower affinity to the developer during alkali development, and a poor resolution.

Suitable selection of the amounts of acid labile groups and crosslinking groups having a C—O—C linkage within the above-indicated ranges enables full and free control of the pattern dimensions and pattern configuration. The contents of the acid labile groups and crosslinking groups having C—O—C linkages in the polymers of the invention affect the dissolution rate contrast of the resist film, and govern the properties of the resist material, such as control of the pattern dimensions and pattern configuration.

The weight average molecular weight of the polymers of the invention must fall within a range of 1,000 to 500,000, and preferably 3,000 to 50,000. At a weight average molecular weight of less than 1,000, the resist has a poor thermal stability, whereas at a molecular weight above 500,000, the alkali solubility is too low, resulting in a poor resolution.

In the polymers of the invention, when the base resin prior to crosslinking has a broad molecular weight distribution (Mw/Mn), both low molecular weight and high molecular weight polymers are present, making the crosslinking number difficult to plan and posing complications for the production of resist materials having a consistent performance. Thus, because the effects of this molecular weight and molecular weight distribution increase as the pattern rule becomes smaller, a narrow molecular weight distribution within a range of 1.0 to 1.5, and especially 1.0 to 1.3, is preferable for obtaining resists that can be effectively used to achieve a fine pattern rule. However, the molecular weight distribution is not limited only to the above range, the use of a base resin having a molecular weight distribution greater than 1.5 also being possible.

A number of methods may be used to prepare the polymers of the invention. One method involves introducing acid labile groups of general formula (5) onto the phenolic hydroxyl groups of a polymer having recurring units of general formula (1), isolating the product, then reacting it with an alkenyl ether compound or a halogenated alkyl ether compound so as to induce intermolecular and/or intramolecular crosslinking with crosslinking groups having C—O—C linkages. Another method involves reacting a polymer having recurring units of general formula (1) with an alkenyl ether compound or a halogenated alkyl ether compound so as to induce intramolecular and/or intermolecular crosslinking with crosslinking groups having C—O—C linkages, isolating the product, then introducing acid labile groups of general formula (5). Yet another method involves reacting a polymer having recurring units of general formula (1) with an alkenyl ether compound or a halogenated alkyl ether compound, and at the same time introducing acid labile groups of general formula (5). The most preferable of these methods is the latter, in which the reaction with an alkenyl ether compound or a halogenated alkyl ether compound is carried out together with the introduction of an acid labile group of general formula (5). Acid labile groups of general formula (6), tertiary alkyl groups, trialkylsilyl groups, or oxoalkyl groups may also be introduced onto the resulting polymer if necessary.

Illustrative examples include a first method which uses a polymer having recurring units of formula (1'), an alkenyl ether compound of general formula (I) or (II) below, and a compound of general formula (5a) below; and a second method which uses a polymer having recurring units of formula (1'), a halogenated alkyl ether compound of general formula (VII) or (VIII), and a compound of general formula (5b) below.

First Method:

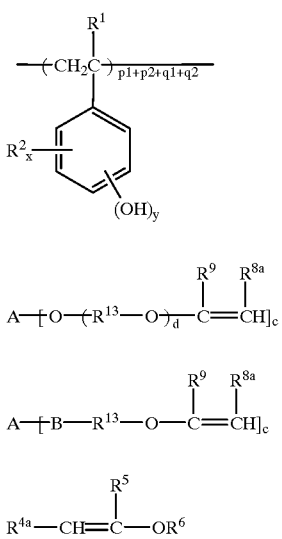

In the above formulas, $R^1$, $R^2$, $R^9$, x, y, p1, p2, q1, and q2 are as defined above, and p1+p2+q1+q2=1. $R^5$ and $R^6$ are also defined as above, and $R^{4a}$ and $R^{8a}$ each represent hydrogen or a straight, branched, or cyclic alkyl of 1 to 7 carbon atoms.

In the vinyl ether compounds of formulas (I) or (II) above, A is a c-valent aliphatic or alicyclic saturated hydrocarbon group, aromatic hydrocarbon group, or heterocyclic group of 1 to 50 carbon atoms which may have an intervening heteroatom, and in which some of the hydrogen atoms attached to the carbon atoms may be substituted with hydroxyl, carboxyl, acyl, or fluorine; B is —CO—O—, —NHCO—O—, or —NHCONH—; $R^{13}$ is a straight, branched or cyclic alkylene of 1 to 10 carbon atoms; and the letter d is 0 or an integer from 1 to 10.

Examples of the c-valent hydrocarbon groups represented by A include substituted or unsubstituted alkylene groups of 1 to 50 carbon atoms, and preferably 1 to 40 carbon atoms, which may have an intervening heteroatom such as O, NH, $N(CH_3)$, S, or $SO_2$, and which may be substituted with hydroxyl, carboxyl, acyl or halogen (e.g., fluorine, chlorine, bromine and iodine); arylene groups of 6 to 50 carbon atoms, and preferably 6 to 40 carbon atoms; combinations of these alkylene groups with these arylene groups; and c'''-valent (wherein c''' is an integer from 3 to 8) groups obtained by removing hydrogen atoms attached to carbon atoms in any of the foregoing groups. Additional examples include c-valent heterocyclic groups, and combinations of these heterocyclic groups with the above hydrocarbon groups.

Illustrative examples of A are given below.

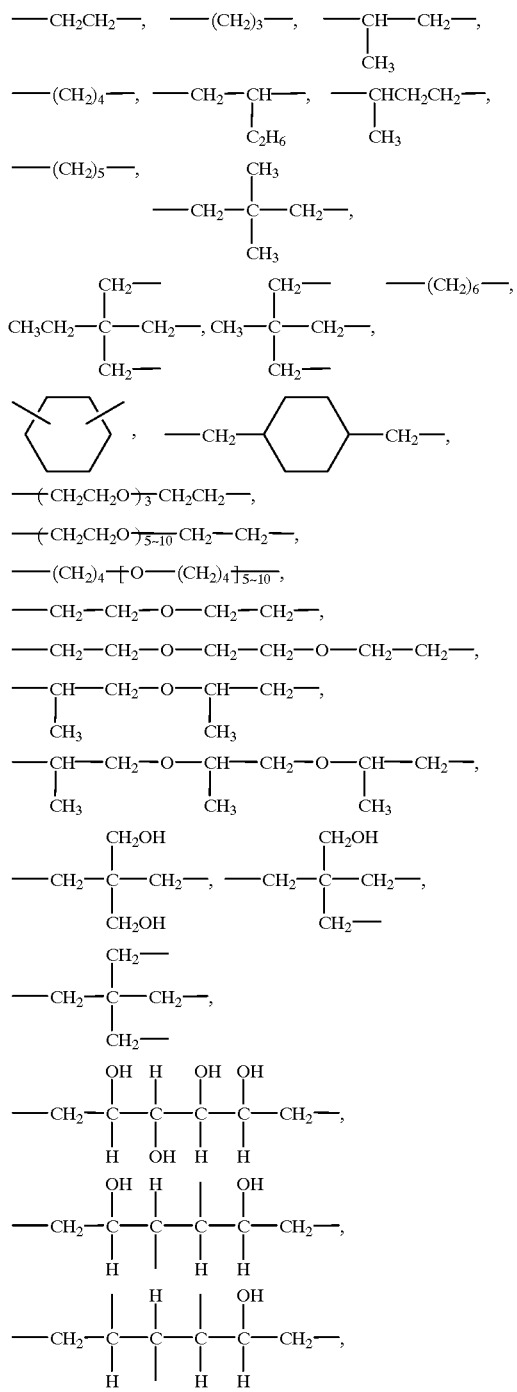

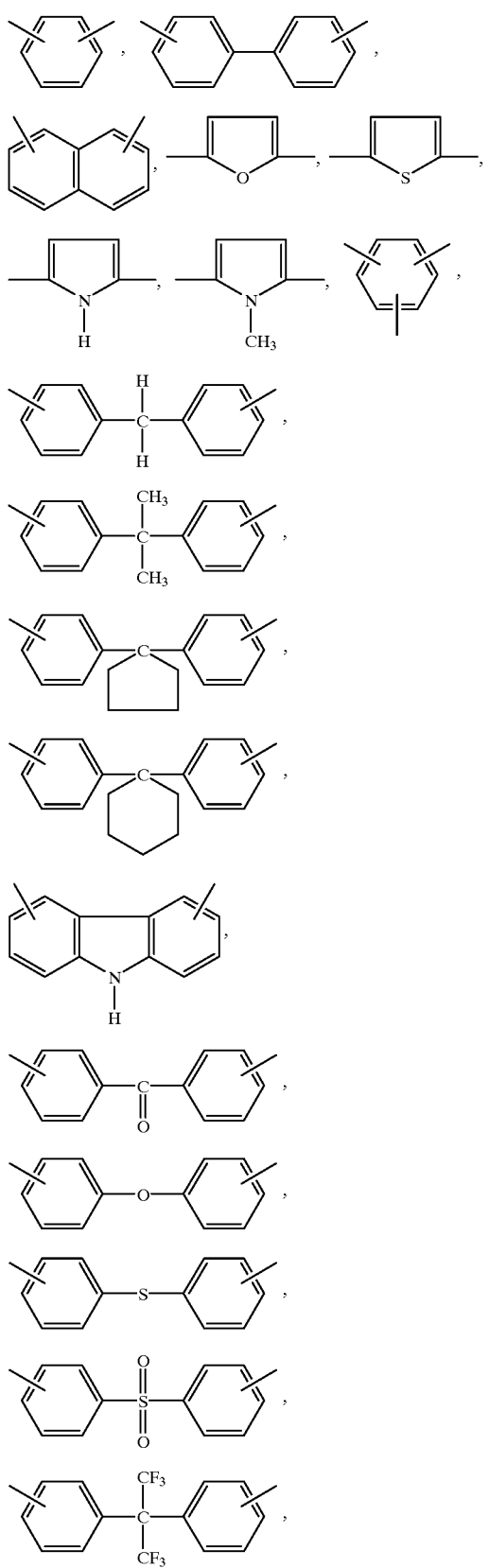
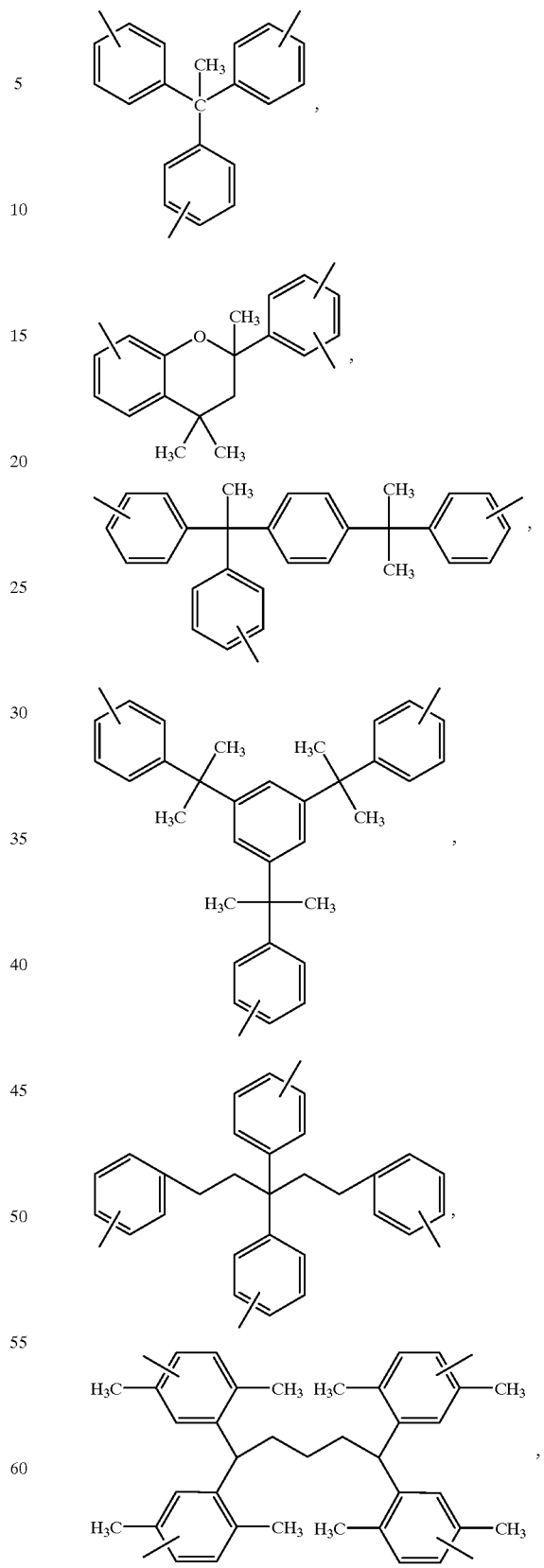

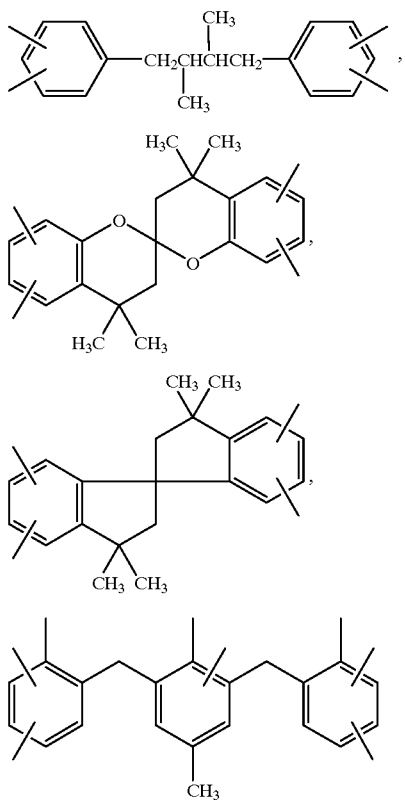

A method such as that described by Stephen C. Lapin in Polymers Paint Colour Journal, 179 (4237), 321 (1988) may be used to prepare the compounds of general formula (I). This method involves synthesis via the reaction of a polyhydric alcohol or a polyhydric phenol with acetylene, or the reaction of a polyhydric alcohol or polyhydric phenol with a halogenated alkyl vinyl ether.

Illustrative, non-limiting examples of compounds having formula (I) include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, (tetramethylene glycol divinyl ether), neopentyl glycol divinyl ether, trimethylolpropane trivinyl ether, trimethylolethane trivinyl ether, hexanediol divinyl ether, 1,4-cyclohexanediol divinyl ether, 1,4-divinyloxymethylcyclohexane, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, and compounds of the formulas (I-1) to (I-31) given below.

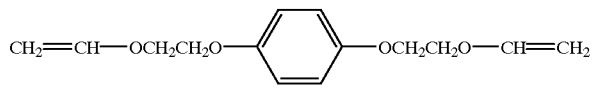

(I-1)

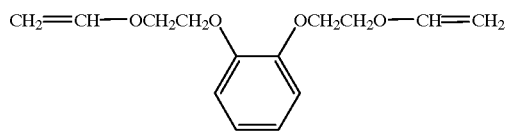

(I-2)

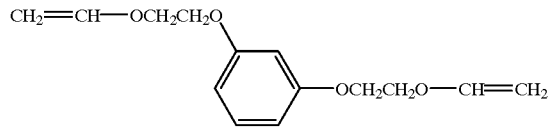

(I-3)

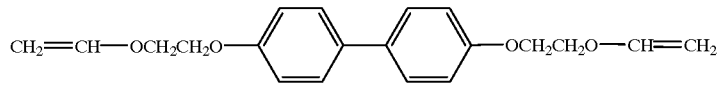

(I-4)

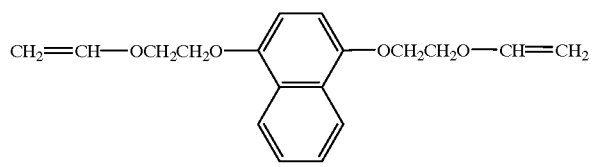

(I-5)

-continued
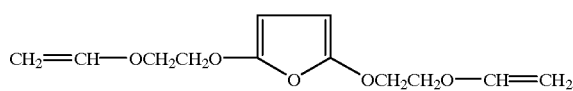
(I-6)
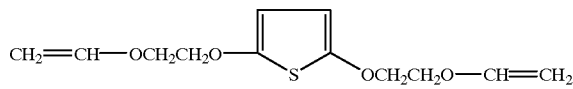
(I-7)
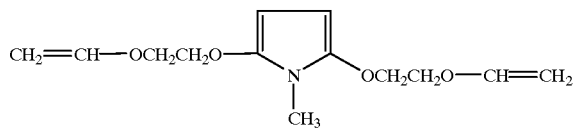
(I-8)
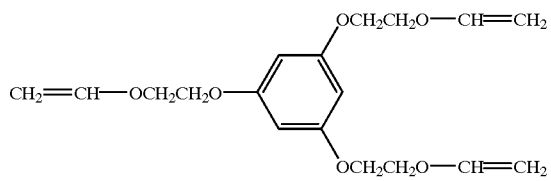
(I-9)
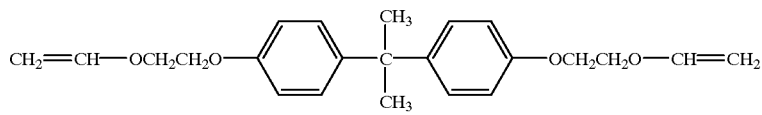
(I-10)
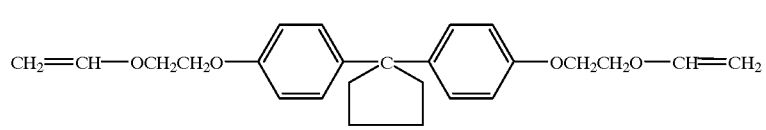
(I-11)
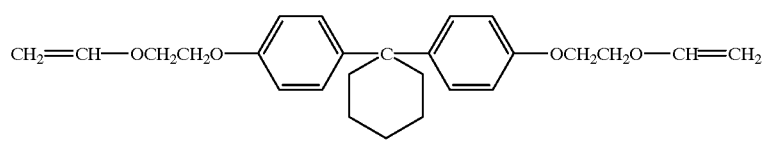
(I-12)
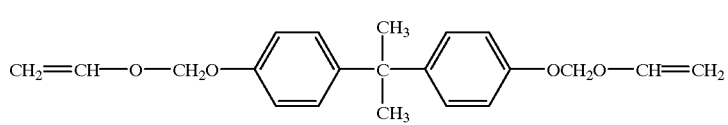
(I-13)
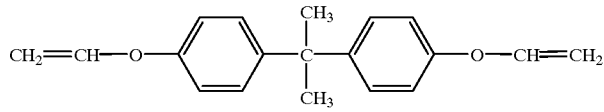
(I-14)
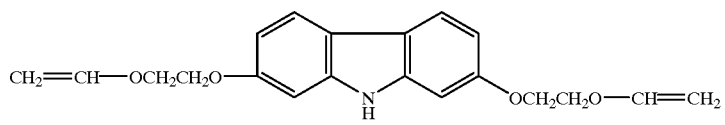
(I-15)
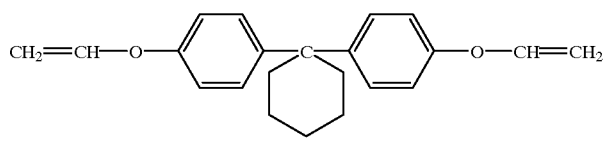
(I-16)

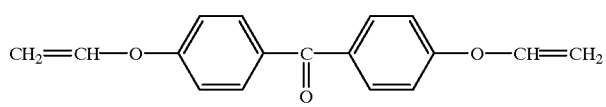
(I-17)
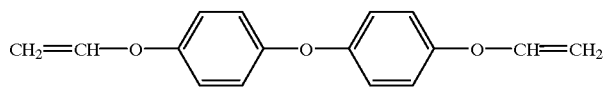
(I-18)
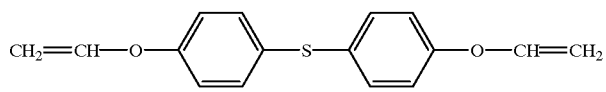
(I-19)
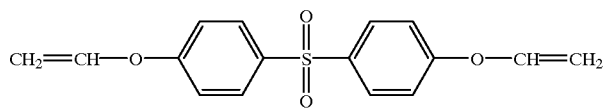
(I-20)
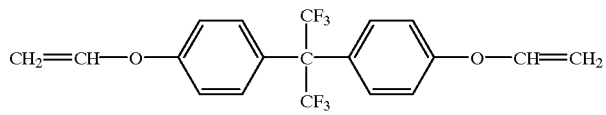
(I-21)
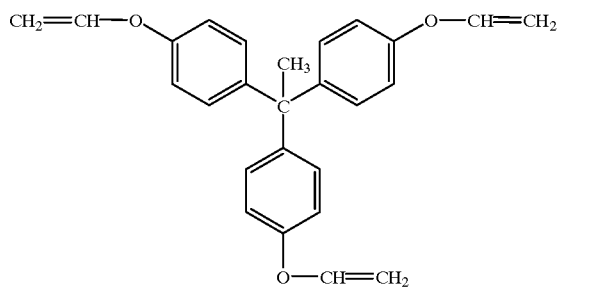
(I-22)
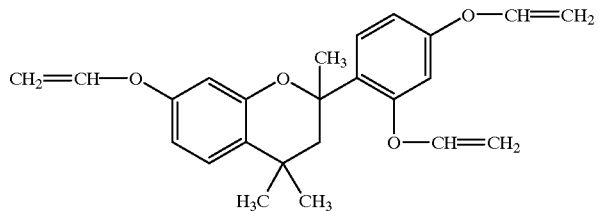
(I-23)
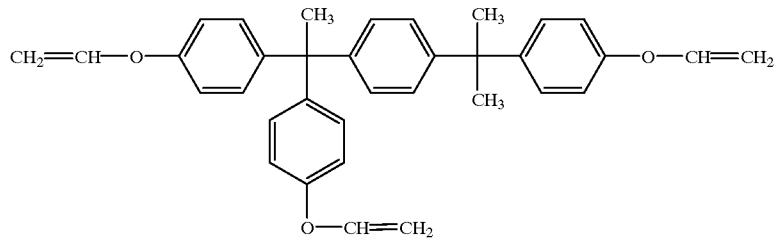
(I-24)

-continued
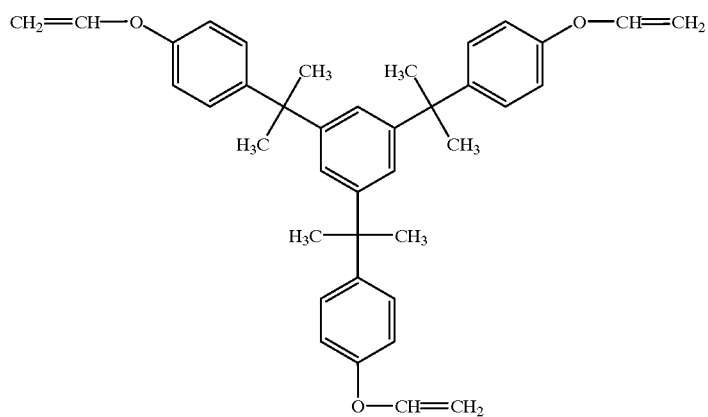
(I-25)
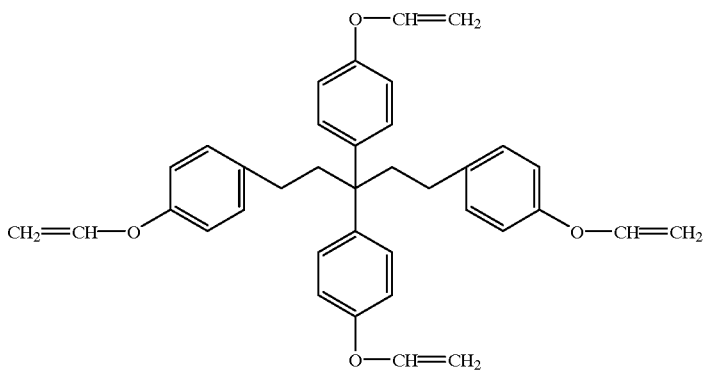
(I-26)
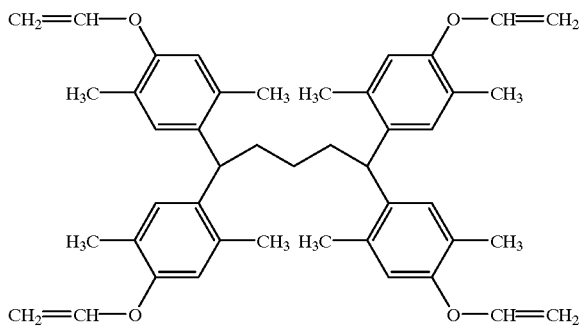
(I-27)
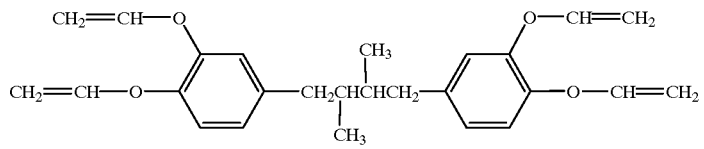
(I-28)
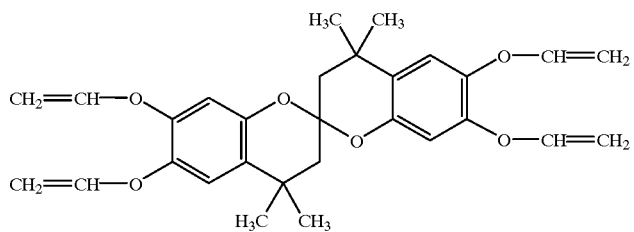
(I-29)

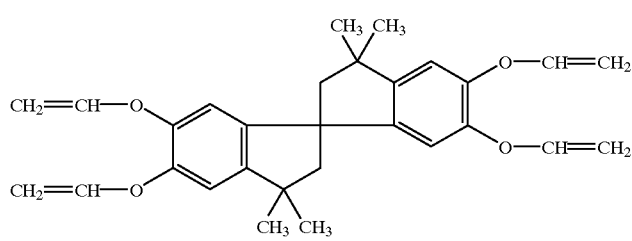
(I-30)

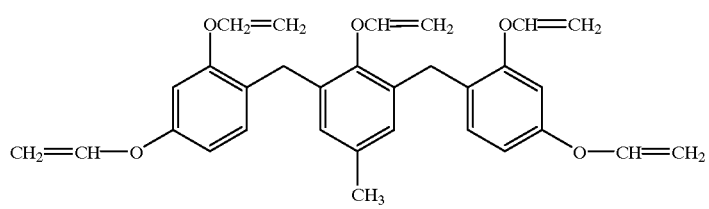
(I-31)

When B is —CO—O, the compound of general formula (II) above may be prepared by reacting a polycarboxylic acid with a halogenated alkyl vinyl ether. Illustrative, non-limiting examples of compounds having formula (II) in which B is —CO—O— include diethylenevinyl ether terephthalate, diethylenevinyl ether phthalate, diethylenevinyl ether isophthalate, dipropylenevinyl ether phthalate, dipropylenevinyl ether terephthalate, dipropylenevinyl ether isophthalate, diethylenevinyl ether maleate, diethylenevinyl ether fumarate, and diethylenevinyl ether itaconate.

Examples of alkenyl ether group-containing compounds which are highly suitable for use in the invention include alkenyl ether group-containing compounds prepared by reacting an active hydrogen-bearing alkenyl ether compound of general formula (III), (IV), or (V) below, for example, with an isocyanate group-bearing compound.

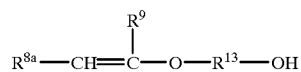
(III)

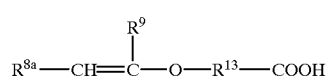
(IV)

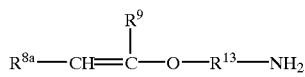
(V)

In these formulas, $R^{8a}$, $R^9$, and $R^{13}$ are as defined above.

When B is —NHCO—O— or —NHCONH—, the compound of general formula (II) above can be prepared by using compounds including those mentioned in Handbook of Crosslinking Agents, Taisei K.K., 1981. Illustrative examples include polyisocyanate compounds such as triphenylmethane triisocyanate, diphenylmethane diisocyanate, tolylene diisocyanate, the dimer of 2,4-tolylene diisocyanate, naphthalene-1,5-diisocyanate, o-tolylene diisocyanate, polymethylene polyphenyl isocyanate, and hexamethylene diisocyanate; and polyisocyanate adducts such as the adduct of tolylene diisocyanate and trimethylolpropane, the adduct of hexamethylene diisocyanate and water, and the adduct of xylene diisocyanate and trimethylolpropane. Various compounds with terminal alkenyl ether groups may be obtained by reacting the above-mentioned isocyanate group-bearing compounds with the active hydrogen-bearing alkenyl ether compounds. Illustrative, non-limiting examples of such compounds include those of the following formulas (II-1) to (II-11).

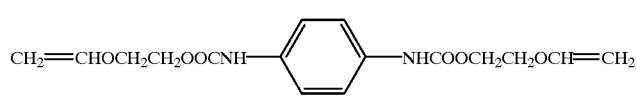
(II-1)

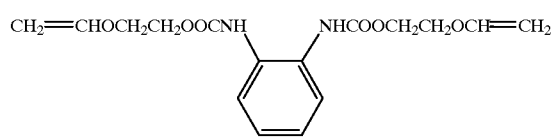
(II-2)

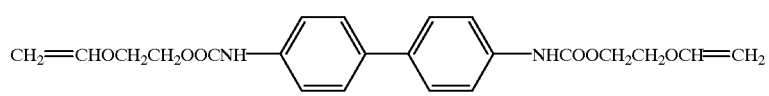
(II-3)

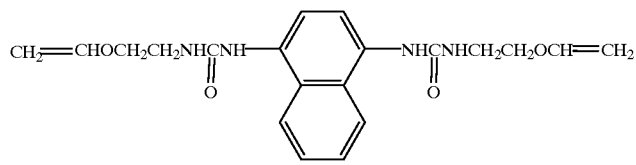
(II-4)

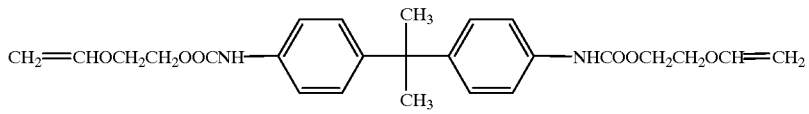
(II-5)

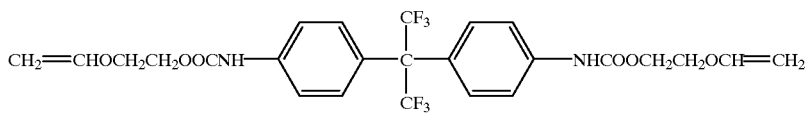
(II-6)

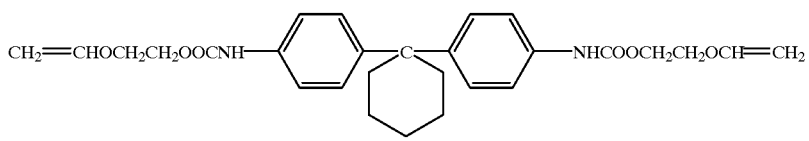
(II-7)

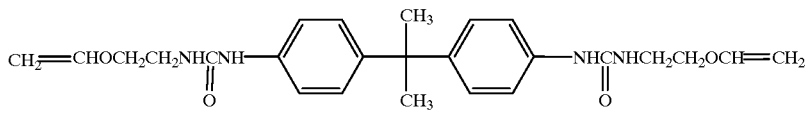
(II-8)

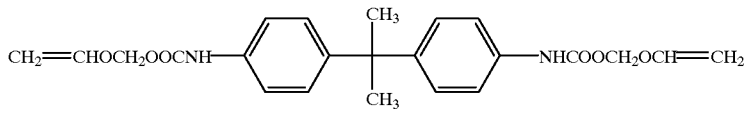
(II-9)

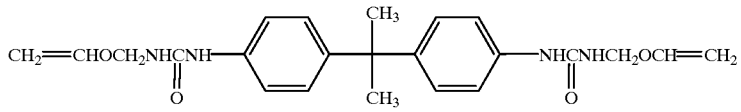
(II-10)

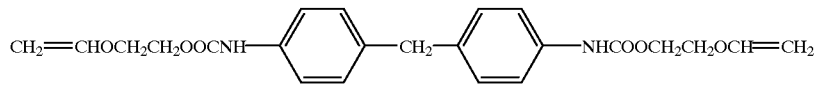
(II-11)

In the first method discussed above, the hydrogen atoms on the phenolic hydroxyl groups of a polymer of general formula (1') having a weight average molecular weight of 1,000 to 500,000 and preferably having a molecular weight distribution of 1.0 to 1.5 are reacted with p1 moles of an alkenyl ether compound of general formula (I) or (II) and q1 moles of a compound of general formula (5a), per mole of all the phenolic hydroxyl groups on the polymer compound, so as give a polymer of general formula (3a'-1) or (3a'-2) below, for example.

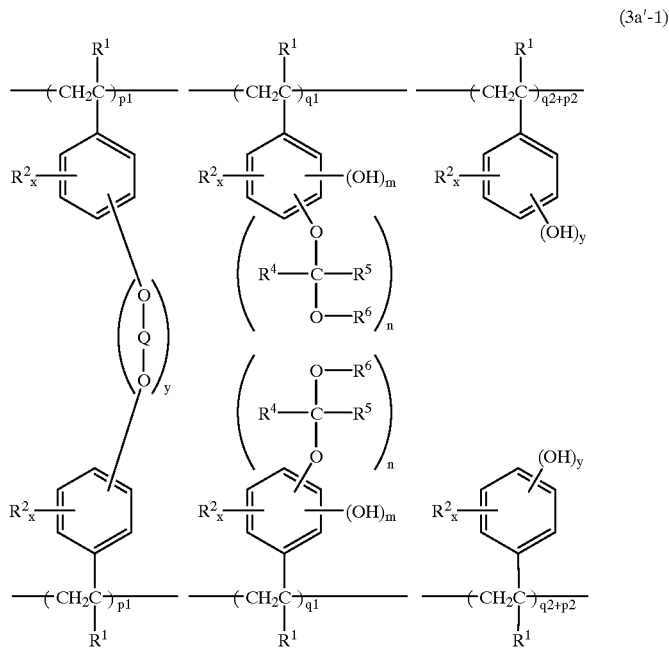

(3a'-1)

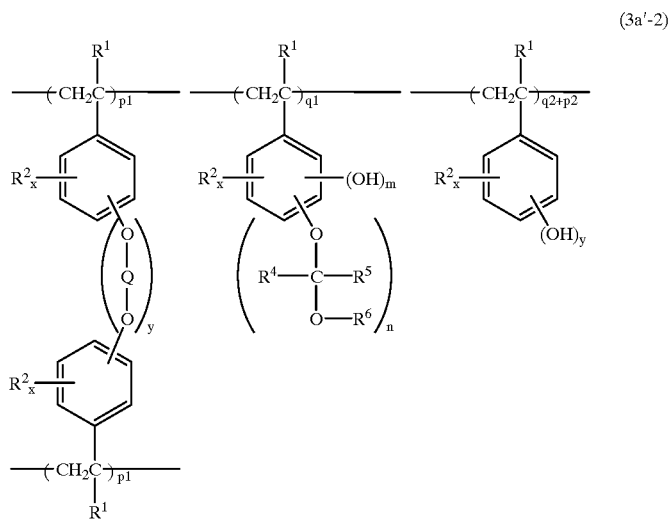

(3a'-2)

In these formulas, m+n=y, and m, n, x, y, p1, p2, q1, q2, $R^1$, $R^2$, $R^4$, $R^5$, $R^6$, and Q are each as defined above.

The reaction solvent is preferably a polar aprotic solvent such as dimethyl formamide, dimethyl acetamide, tetrahydrofuran, or ethyl acetate. These may be used alone or as mixtures of two or more thereof.

Preferable examples of the acid which serves as the catalyst include hydrochloric acid, sulfuric acid, trifluoromethanesulfonic acid, p-toluenesulfonic acid, methanesulfonic acid, trifluoroacetic acid, and the pyridinium salt of p-toluenesulfonic acid. The amount of the acid catalyst used is preferably 0.1 to 10 mol % based on the moles of the entire phenolic hydroxyl groups of the polymer having general formula (1'). The reaction temperature is −20 to 100° C., and preferably 0 to 60° C., and the reaction time is 0.2 to 100 hours, and preferably 0.5 to 20 hours.

When the above reactions are carried out together rather than separately, although no particular limit is imposed on the order in which the alkenyl ether compound of general formula (I) or (II) and the compound of general formula (5a) are added, it is preferable to add first the compound of general formula (5a) and later, after the reaction has proceeded to a sufficient degree, to add the alkenyl ether compound of general formula (I) or (II). The reason is that, in cases where the alkenyl ether compound of general formula (I) or (II) and the compound of general formula (5a) are added at the same time or the alkenyl ether compound of general formula (I) or (II) is added first, some of the reaction sites on the alkenyl ether compound are hydrolyzed by moisture within the reaction system, which complicates the structure of the polymer and makes its physical properties difficult to control.

Second Method:

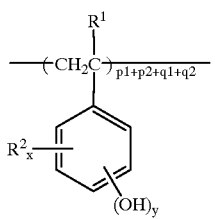
(1')

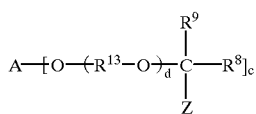
(VI)

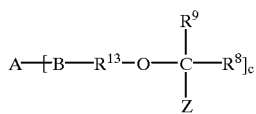
(VII)

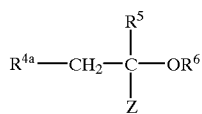
(5b)

In these formulas, $R^1$, $R^2$, x, y, p1, p2, q1, q2, $R^4$, $R^5$, $R^6$, $R^8$, $R^9$, $R^{13}$, A, B, c, and d are each as defined above, and Z is a halogen atom (chlorine, bromine, or iodine).

The compounds of formulas (VI) and (VII) and the compounds of formula (5b) may be obtained by reacting hydrogen chloride, hydrogen bromide, or hydrogen iodide with compounds of formula (I) or (II) above or compounds of formula (5a).

In the second method, a polymer having recurring units of general formula (1'), a weight average molecular weight of 1,000 to 500,000, and preferably a molecular weight distribution of 1.0 to 1.5, is reacted with p1 moles of a halogenated alkyl ether compound of general formula (VI) or (VII) and q1 moles of a compound of general formula (5b) per mole of phenolic hydroxyl groups on the polymer to give a polymer of general formula (3a'-1) or (3a'-2) above, for example.

This method is preferably carried out in a solvent and in the presence of a base. The solvent is preferably a polar aprotic solvent such as acetonitrile, acetone, dimethylformamide, dimethylacetamide, tetrahydrofuran, or dimethylsulfoxide. These may be used alone or as mixtures of two or more thereof. Preferable examples of the base include triethylamine, pyridine, diisopropylamine, and potassium carbonate. The amount of base used is preferably at least p1+q1 moles per mole of phenolic hydroxyl groups on the polymer of general formula (1) which is reacted. The reaction temperature is −50 to 100° C., and preferably 0 to 60° C., and the reaction time is 0.5 to 100 hours, and preferably 1 to 20 hours.

As described above, a compound of formula (5a) or (5b) is reacted with a polymer having recurring units of formula (1') to give a compound of formula (7) below, which is then separated off and subsequently crosslinked using a compound of formula (I) or (II), or a compound of formula (VI) or (VII).

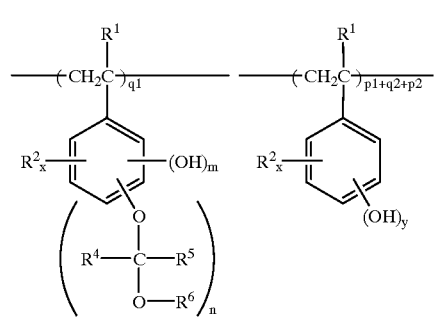
(7)

If necessary, the polymer of formula (3a'-1) or (3a'-2), for example, which has been obtained by the above first method or second method may have introduced thereon an acid labile group of general formula (6) by reaction with q2 moles of a dialkyl dicarbonate compound, an alkoxycarbonyl alkyl halide or the like per mole of phenolic hydroxyl groups on the original polymer of general formula (1'), or may be reacted with a tertiary alkyl halide, a trialkylsilyl halide, or an oxoalkyl compound, to give a polymer of general formula (3b'-1) or (3b'-2).

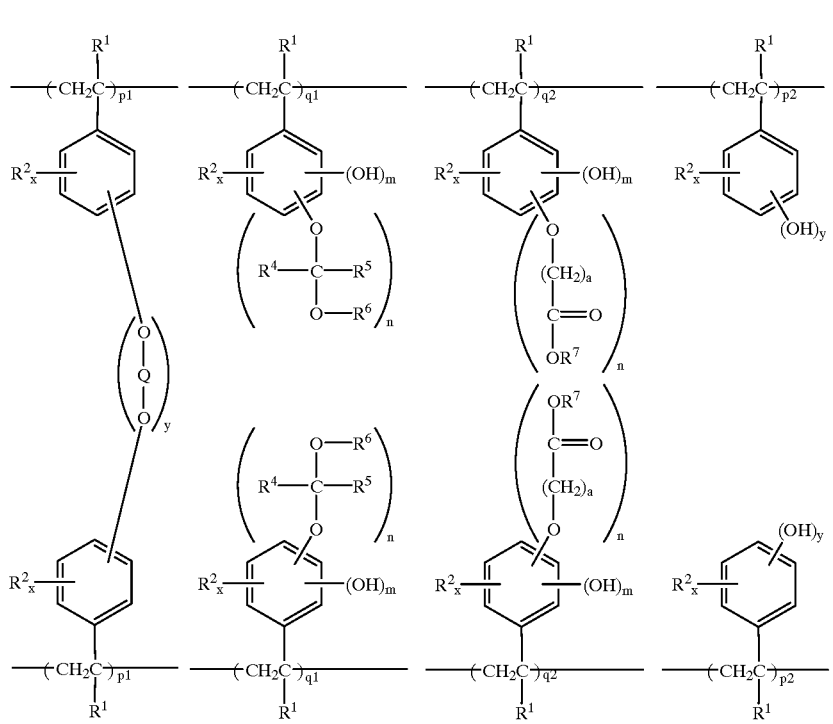

(3b'-1)

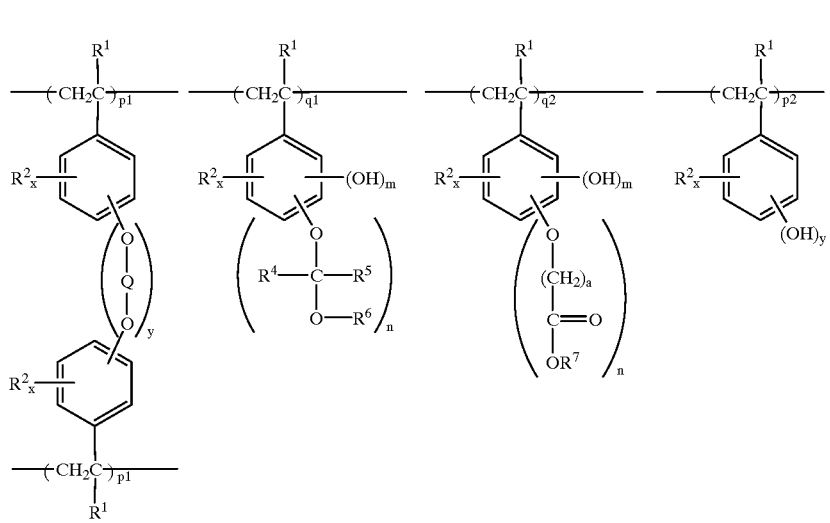

(3b'-2)

Acid labile groups of formula (6) are preferably introduced in a solvent and in the presence of a base. The solvent is preferably a polar aprotic solvent such as acetonitrile, acetone, dimethylformamide, dimethylacetamide, tetrahydrofuran, or dimethylsulfoxide. These may be used alone or as mixtures of two or more thereof. Preferable examples of the base include triethylamine, pyridine, imidazole, diisopropylamine, and potassium carbonate. The amount of base used is preferably at least q2 moles per mole of phenolic hydroxyl groups on the original polymer of general formula (1'). The reaction temperature is 0 to 100° C., and preferably 0 to 60° C., and the reaction time is 0.2 to 100 hours, and preferably 1 to 10 hours.

Illustrative examples of the dialkyl dicarbonate compound include di-tert-butyl dicarbonate and di-tert-amyl dicarbonate. Illustrative examples of the alkoxycarbonyl alkyl halide include tert-butoxycarbonyl methyl chloride, tert-amyloxycarbonyl methyl chloride, tert-butoxycarbonyl methyl bromide, tert-butoxycarbonyl ethyl chloride, ethoxyethoxycarbonyl methyl chloride, ethoxyethoxycarbonyl methyl bromide, tetrahydropyranyloxycarbonyl methyl chloride, tetrahydropyranyloxycarbonyl methyl bromide, tetrahydrofuranyloxycarbonyl methyl chloride, and tetrahydrofuranyloxycarbonyl methyl bromide; and trialkylsilyl halides such as trimethylsilyl chloride, triethylsilyl chloride, and dimethyl-tert-butylsilyl chloride.

If necessary, the polymer of general formula (3a'-1) or (3a'-2) obtained by the above first or second method may be tertiary alkylated or oxoalkylated by reaction with q2 moles of a tertiary alkylating agent or an oxoalkyl compound per mole of the phenolic hydroxyl groups on the original polymer of general formula (1').

These methods are preferably carried out in a solvent and in the presence of a acid. The solvent is preferably a polar aprotic solvent such as dimethylformamide, dimethylacetamide, tetrahydrofuran, or ethyl acetate. These may be used alone or as mixtures of two or more thereof. Preferable examples of the acid serving as the catalyst include hydrochloric acid, sulfuric acid, trifluoromethanesulfonic acid, p-toluenesulfonic acid, methanesulfonic acid, trifluoroacetic acid, and the pyridinium salt of p-toluenesulfonic acid. The amount of acid used is preferably 0.1 to 10 mol % per mole of the phenolic hydroxyl groups on the original polymer of general formula (1'). The reaction temperature is –20 to 100° C., and preferably 0 to 60° C., and the reaction time is 0.2 to 100 hours, and preferably 0.5 to 20 hours.

Examples of suitable tertiary alkylating agents include isobutene, 2-methyl-1-butene, and 2-methyl-2-butene. Examples of suitable oxoalkyl compounds include α-angelica lactone, 2-cyclohexene-1-one, and 5,6-dihydro-2H-pyran-2-one.

An alternative to preparation via a polymer of general formula (3a'-1) or (3a'-2) is to first directly introduce acid labile groups of general formula (6), tertiary alkyl groups, trialkylsilyl groups, or oxoalkyl groups onto a polymer having recurring units of general formula (3c'-1) or (3c'-2) below, then introduce acid labile groups of general formula (5) if necessary.

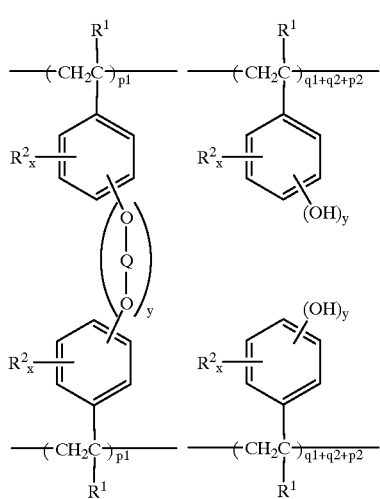

(3c'-1)

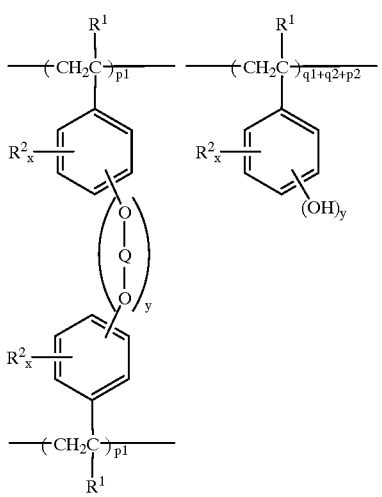

(3c'-2)

In these formulas, $R^1$, $R^2$, Q, p1, p2, q1, q2, x, and y are each as defined above.

It is possible to introduce not only one, but even two or more different acid labile groups represented by $R^3$ into the polymers of the invention. In this case, first q1 moles of an acid labile group are introduced as described above per mole of all the hydroxyl groups on the polymer of formula (1'), then q2 moles of a different acid labile group are introduced by the same method, thereby giving a polymer in which these two types of acid labile groups or, by suitable repetition of this operation, an even greater number of types of acid labile groups are introduced.

Two or more of the above polymers are used as the base resin in the present invention. That is, the base resin is formulated by combining two or more types of polymers which differ as to their weight average molecular weight, acid labile group content, crosslinking group content, type of acid labile group, or type of crosslinking group.

When the above polymers which are combined differ in their weight average molecular weights, it is advantageous for a high-molecular-weight polymer having a weight average molecular weight of 20,000 to 500,000, preferably 20,000 to 100,000, and more preferably 20,000 to 50,000 to be mixed with a low-molecular-weight polymer having a weight average molecular weight of at least 1,000 but less than 20,000, preferably at least 3,000 but less than 20,000, and more preferably at least 5,000 but less than 20,000, in a weight ratio of from 95:5 to 20:80, preferably 95:5 to 40:60, and more preferably 90:10 to 50:50. Such mixture enables improvement in adhesion of the resist composition to various types of substrates. Advantageously, the difference in the weight average molecular weights of the high-molecular-weight polymer and the low-molecular-weight polymer ranges from 1,000 to 400,000, preferably from 3,000 to 100,000, and more preferably from 3,000 to 50,000.

In cases where polymers of differing acid labile group contents or crosslinking group contents are combined, when polymers having the same types of acid labile groups and/or crosslinking groups are used, it is desirable for polymers in which the difference in degree of substitution by acid labile groups and/or crosslinking groups is not more than 8 mol %, preferably not more than 5 mol %, and more preferably not more than 3 mol %, to be mixed in a weight ratio ranging from 99:1 to 50:50, preferably 95:5 to 50:50, and more preferably 90:10 to 50:50. In the delicate adjustment of thinning of the resist film, this helps to ensure uniformity of production without compromising resist performance. When polymers having different types of acid labile groups and/or crosslinking groups are used, they may be freely combined outside of the above range in the difference in degree of substitution by acid labile groups and/or crosslinking groups, although combination within this range is preferred.

When polymers having different types of acid labile groups and/or crosslinking groups are combined, acid labile groups and/or crosslinking groups which satisfy the requirements of the resist composition may be used in any suitable combination. Preferred combinations include a polymer of general formula (3a'-1) or (3a'-2) in combination with a polymer of general formula (3b'-1) or (3b'-2). In the polymer of formula (3a'-1) or (3a'-2) and the polymer of formula (3b'-1) or (3b-2), the groups $R^4$, $R^5$, and $R^6$ may be the same or different. Also, the types of acid labile groups and the types of crosslinking groups within the molecules need not all differ between the polymers that are combined.

Composition

The resist composition of the present invention uses the above-described polymers as the base resin. More particularly, the resist composition of the invention contain the following components:

(A) an organic solvent;

(B) a combination of at least two polymers of formula (1) above, preferably formula (2), and more preferably formula (3), which polymers preferably differ in their weight average molecular weight, acid labile group content, crosslinking group content, acid labile group type, or crosslinking group type; and (C) a photoacid generator.

In addition to above components (A) to (C), the resist composition may further include one or more of the following components (D) to (I):

(D) a basic compound, preferably an aliphatic amine;

(E) an aromatic compound having a $\equiv$C—COOH group within the molecule;

(F) a base resin other than component (B) which is another polymer comprising recurring units of general formula (1):

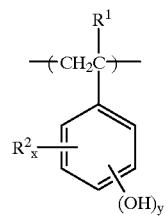

wherein $R^1$ is hydrogen or methyl; $R^2$ is a straight, branched, or cyclic alkyl of 1 to 8 carbon atoms; and x is 0 or a positive integer and y is a positive integer, satisfying $x+y \leq 5$, an average of at least 0 mol %, but not more than 80 mol %, of all the hydrogen atoms on the phenolic hydroxyl groups being partially substituted with at least one type of acid labile group, the other polymer having a weight average molecular weight of 3,000 to 300,000;

(G) a dissolution regulator;

(H) an UV absorber; and (I) an acetylene alcohol derivative.

The resist composition of the invention may be either positive or negative working and is effective as the chemical amplification type. It is especially effective as a chemical amplification type positive working resist composition which can be developed with aqueous base. When the composition is used as a negative working resist, an organic solvent is used as the developer.

The organic solvent used as component (A) in the invention may be any organic solvent in which the photoacid generator, base resin, dissolution regulator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, the photoacid generator serving as one of the resist components is most soluble in diethylene glycol dimethyl ether, 1-ethoxy-2-propanol and ethyl lactate, and so the use of one of these, the safe solvent propylene glycol monomethyl ether acetate, or a mixed solvent thereof, is preferred.

Suitable examples of the photoacid generator serving as component (C) include onium salts of general formula (11) below, diazomethane derivatives of formula (12), glyoxime derivatives of formula (13), β-ketosulfone derivatives, disulfone derivatives, nitrobenzylsulfonate derivatives, sulfonic acid ester derivatives, and imidoyl sulfonate derivatives.

 (11)

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; K⁻ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxy-phenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butyl-phenyl, and dimethylphenyl. Exemplary aralkyl groups include benzyl and phenethyl. Examples of the non-nucleophilic counter-ion represented by K⁻ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

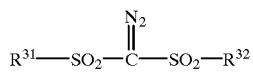

(12)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

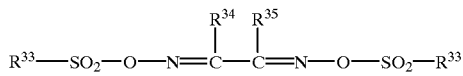

(13)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:
onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl) phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl) diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl) diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl) diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.2 to 15 parts (all parts here and below are by weight), and especially 0.5 to 8 parts, per 100 parts of all the base resins. At less than 0.2 part, the amount of acid generated during exposure would be too low and the sensitivity and resolution are poor, whereas the addition of more than 15 parts would lower the transmittance of the resist and results in a poor resolution.

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. (See, for example, JP-A 232706/1993, JP-A 249683/1993, JP-A 158239/1993, JP-A 249662/1993, JP-A 257282/1993, JP-A 289322/1993, and JP-A 289340/1993).

Examples of basic compounds suitable for use as component (D) include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, *methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (14) and (15) may also be included.

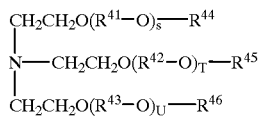

(14)

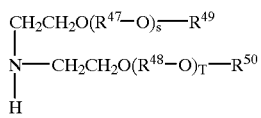

(15)

In the formulas, $R^{41}$, $R^{42}$, $R^{43}$, $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (14) and (15) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of 0.01 to 2 parts, and especially 0.01 to 1 part, per 100 parts of all the base resins. At less than 0.01 part, the desired effects of the basic compound would not be apparent, while the use of more than 2 parts would result in too low a sensitivity.

Exemplary, non-limiting aromatic compounds bearing a ≡OC—COOH group (preferably —$R^{57}$—COOH wherein $R^{57}$ is a straight or branched alkylene of 1 to 10 carbon atoms) which may be formulated as component (E) include one or more compounds selected from Groups I and II below. Including component (E) improves the PED stability of the resist and ameliorates edge roughness on nitride film substrates.

Group I:

Compounds in which some or all of the hydrogen atoms on the phenolic hydroxyl groups of the compounds of general formulas (16) to (25) below have been replaced with —$R^{57}$—COOH (wherein $R^{57}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

(16)

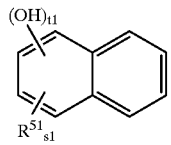

-continued

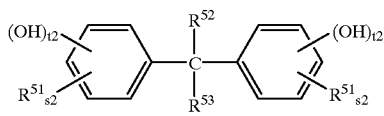
(17)

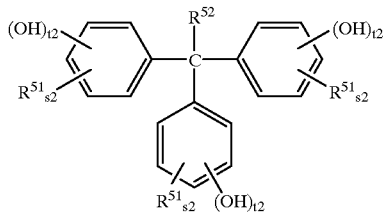
(18)

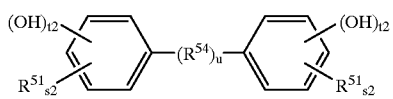
(19)

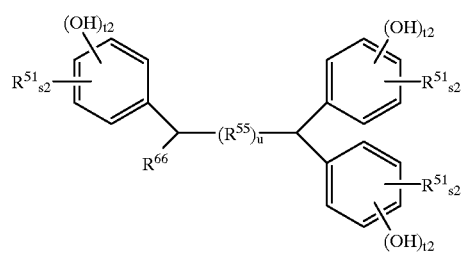
(20)

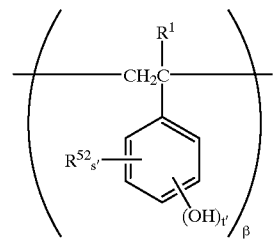
(21)

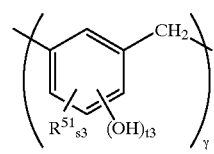
(22)

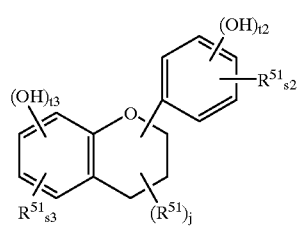
(23)

-continued

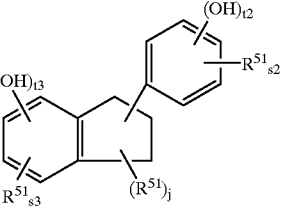
(24)

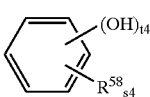
(25)

In these formulas, $R^1$ is hydrogen or methyl; $R^{51}$ and $R^{52}$ are each hydrogen or a straight or branched alkyl or alkenyl of 1 to 8 carbon atoms; $R^{53}$ is hydrogen, a straight or branched alkyl or alkenyl of 1 to 8 carbon atoms, or a $(R^{57})_h$—COOR' group (R1 being hydrogen or —$R^{57}$—COOH); $R^{54}$ is —$(CH_2)_i$— (where i is 2 to 10), an arylene of 6 to 10 carbon atoms, carbonyl, sulfonyl, an oxygen atom, or a sulfur atom; $R^{55}$ is an alkylene of 1 to 10 carbon atoms, an arylene of 6 to 10 carbon atoms, carbonyl, sulfonyl, an oxygen atom, or a sulfur atom; $R^{56}$ is hydrogen, a straight or branched alkyl or alkenyl of 1 to 8 carbon atoms, or a hydroxyl-substituted phenyl or naphthyl; $R^{57}$ is a straight or branched alkylene of 1 to 10 carbon atoms; $R^{58}$ is hydrogen, a straight or branched alkyl or alkenyl of 1 to 8 carbon atoms, or a —$R^{57}$—COOH group; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; β is a number such that the weight average molecular weight of the compound of formula (21) is from 1,000 to 5,000; and γ is a number such that the weight average molecular weight of the compound of formula (22) is from 1,000 to 10,000.

Group II:

Compounds of general formulas (26) and (27) below.

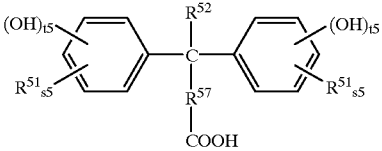
(26)

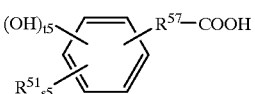
(27)

In these formulas, $R^{51}$, $R^{52}$, and $R^{57}$ are as defined above; and s5 and t5 are numbers which satisfy s5≧0, t5≧0, and s5+t5=5.

Illustrative, non-limiting examples of compounds suitable as above component (E) include compounds of the general formulas III-1 to III-14 and IV-1 to IV-6 below.

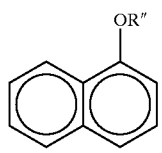 (III-1)
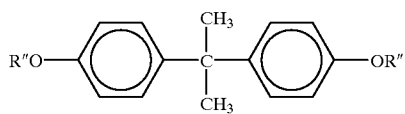 (III-2)
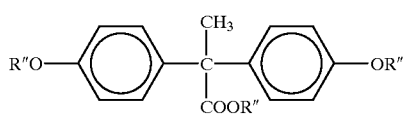 (III-3)
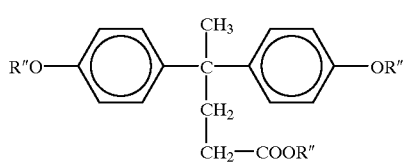 (III-4)
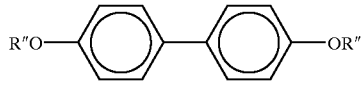 (III-5)
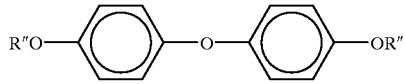 (III-6)
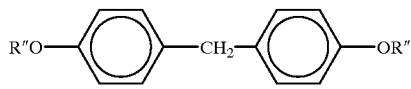 (III-7)
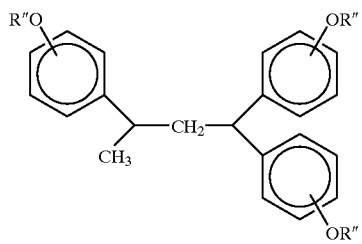 (III-8)
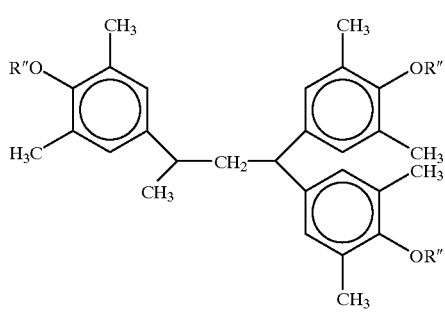 (III-9)
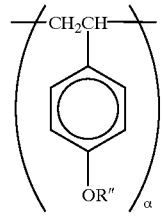 (III-10)
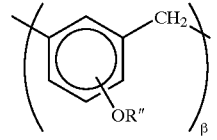 (III-11)
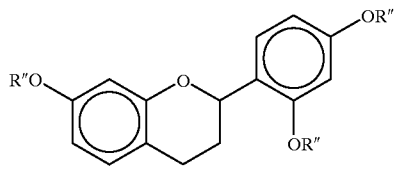 (III-12)
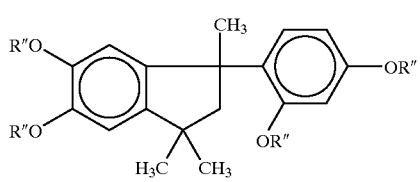 (III-13)
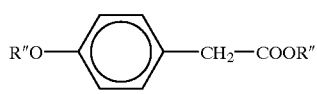 (III-14)
In the above formulas, R' is hydrogen or a $CH_2COOH$ group such that the $CH_2COOH$ group accounts for 10 to 100 mol % of R' in each compound, α and β are as defined above.
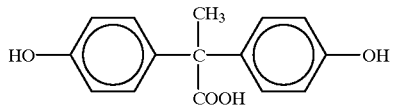 (IV-1)
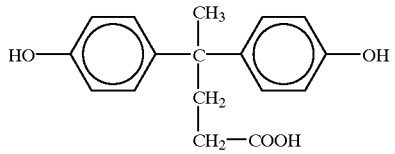 (IV-2)
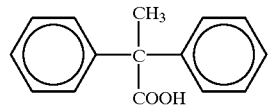 (IV II-3)

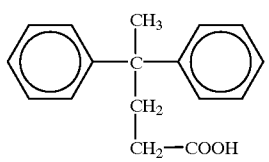

(IV-4)

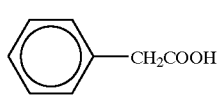

(IV-5)

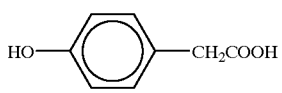

(IV-6)

The aromatic compound bearing a ≡C—COOH group within the molecule may be used singly or as combinations of two or more thereof.

The aromatic compound bearing a ≡C—COOH group within the molecule is added in an amount ranging from 0.1 to 5 parts, and preferably 1 to 3 parts, per 100 parts of the base resin. At less than 0.1 part, sufficient improvement would not be achieved with regard to either footing on nitride film substrates or PED improvement. On the other hand, at more than 5 parts, the resolution of the resist material would be unacceptably low.

Component (F), which is a base resin other than the crosslinked polymers of component (B) described above, is preferably a polymer having a weight average molecular weight of from 3,000 to 300,000 that has recurring units of general formula (10) below.

Including component (F) is advantageous because it enables free control of the pattern dimensions and the pattern configuration.

corresponding ratio of f is more than 0.5, the corresponding ratio of g is more than 0.9, or the corresponding ratio of g is less than 0.4, the alkali dissolution rate contrast is too small, resulting in a poor resolution. Suitable selection of the numbers e, f and g within the above ranges makes it possible to freely control the pattern dimensions and the pattern configuration.

This polymer must have a weight average molecular weight in a range of from 3,000 to 300,000, and preferably from 5,000 to 30,000. At a weight average molecular weight of less than 3,000, the resist has a poor thermal stability, whereas above 300,000, the alkali solubility is too low to provide an acceptable resolution.

When the base resin serving as component (F) has a broad molecular weight distribution (Mw/Mn), both low molecular weight and high molecular weight polymers are present. Too much low molecular weight polymer results in a decreased thermal stability, while too much high molecular weight polymer makes this base resin insufficiently soluble in alkali, which can lead to footing at the end of pattern formation. Therefore, given that these effects of molecular weight and molecular weight distribution tend to increase as the pattern rule becomes smaller, to obtain a resist suitable for a fine pattern rule, the base resin should preferably have a narrow molecular weight distribution of 1.0 to 2.5, and especially 1.0 to 1.5.

The component (F) base resin and the component (B) base resin, which is comprised of crosslinked polymers, are preferably formulated in a ratio of from 0:100 to 90:10, and especially 0:100 to 50:50. When the component (F) base resin is formulated in an amount greater than this weight ratio, the desirable effects of the component (B) base resin comprised of crosslinked polymers are not achieved.

The resist composition of the invention may also include, as component (G), a dissolution regulator for enhancing the contrast. The dissolution regulator formulated in the resist composition is a compound having an average molecular weight within a range of 100 to 1,000, and preferably 150 to

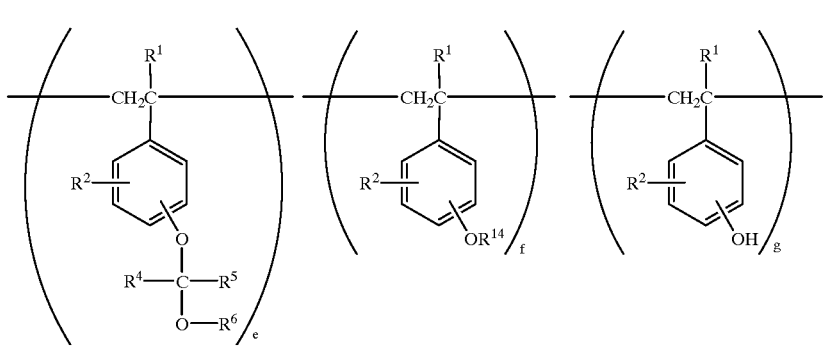

(10)

In this formula, $R^1$, $R^2$, $R^4$, $R^5$, and $R^6$ are as defined above; and $R^{14}$ is an acid labile group other than those of formula (5), such as a group of formula (6), a tertiary alkyl group of 4 to 20 carbon atoms, a trialkylsilyl group in which each of the alkyls has 1 to 6 carbon atoms, or an oxoalkyl group having 4 to 20 carbon atoms.

Also, the letters e and f are each 0 or a positive number and may both be 0, and g is a positive number, such that e+f+g=1. The constituent ratios are satisfying $0 \leq e/(e+f+g) \leq 0.5$, and preferably $0.1 \leq e/(e+f+g) \leq 0.4$; satisfy $0 \leq f/(e+f+g) \leq 0.5$, and preferably $0 \leq f/(e+f+g) \leq 0.2$; and satisfy $0.4 \leq g/(e+f+g) \leq 0.9$, and preferably $0.6 \leq g/(e+f+g) \leq 0.8$. If the ratio of e to the sum e+f+g is more than 0.5, the 800, and having on the molecule at least two phenolic hydroxyl groups, in which an average of from 0 to 100 mol % of all the hydrogen atoms on the phenolic hydroxyl groups have been replaced with acid labile groups.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %.

Preferable examples of such compounds having two or more phenolic hydroxyl groups include those of formulas (i) to (xi) below.

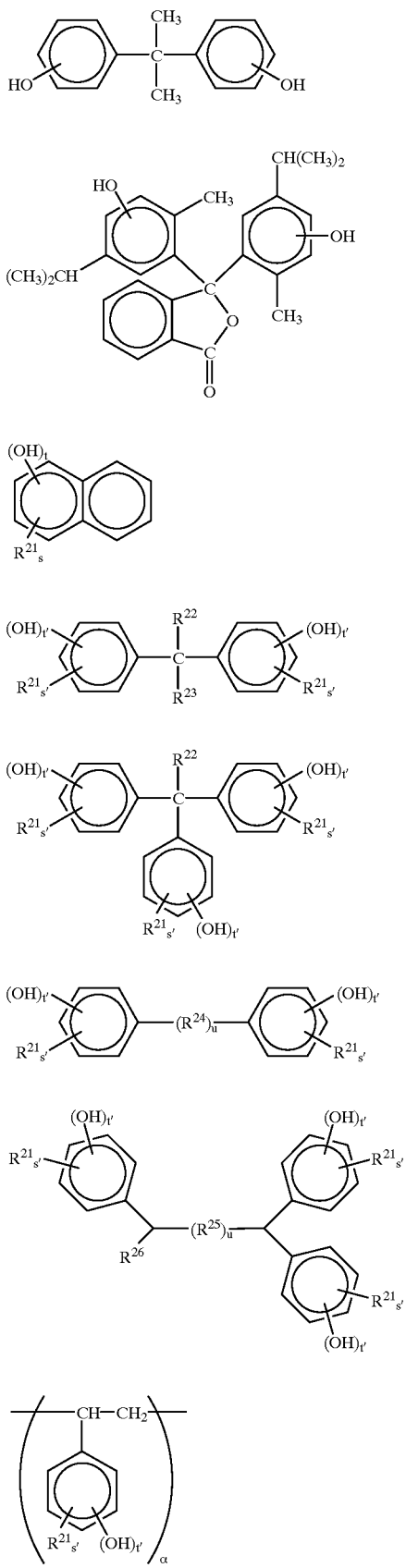
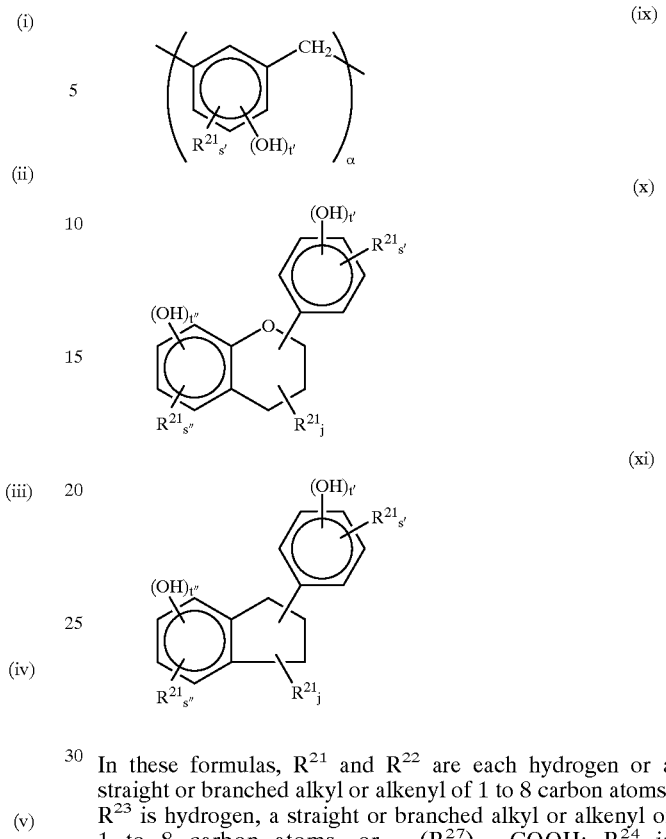

In these formulas, $R^{21}$ and $R^{22}$ are each hydrogen or a straight or branched alkyl or alkenyl of 1 to 8 carbon atoms; $R^{23}$ is hydrogen, a straight or branched alkyl or alkenyl of 1 to 8 carbon atoms, or $—(R^{27})_h—COOH$; $R^{24}$ is $—(CH_2)_i—$ (where i=2 to 10), an arylene of 6 to 10 carbon atoms, carbonyl, sulfonyl, an oxygen atom, or a sulfur atom; $R^{25}$ is an alkylene of 1 to 10 carbon atoms, an arylene of 6 to 10 carbon atoms, carbonyl, sulfonyl, an oxygen atom, or a sulfur atom; $R^{26}$ is hydrogen, a straight or branched alkyl or alkenyl of 1 to 8 carbon atoms, or a hydroxyl-substituted phenyl or naphthyl; $R^{27}$ is a straight or branched alkylene of 1 to 10 carbon atoms; the letter j is an integer from 0 to 5; u and h are each 0 or 1; s, t, s', t', s", and t" are each numbers which satisfy s+t=8, s'+t1=5, and s"+t"=4, and are such that each phenyl skeleton has at least one hydroxyl group; and α is a number such that the molecular weight of the compounds of formula (viii) or (ix) is from 100 to 1,000.

In the above formulas, suitable examples of $R^{21}$ and $R^{22}$ include hydrogen, methyl, ethyl, butyl, propyl, ethynyl, and cyclohexyl; suitable examples of $R^{23}$ include the same groups as for $R^{21}$ and $R^{22}$, as well as —COOH and —CH$_2$COOH; suitable examples of $R^{24}$ include ethylene, phenylene, carbonyl, sulfonyl, oxygen, and sulfur; suitable examples of $R^{25}$ include methylene as well as the same groups as for $R^{24}$; and suitable examples of $R^{26}$ include hydrogen, methyl, ethyl, butyl, propyl, ethynyl, cyclohexyl, and hydroxyl-substituted phenyl or naphthyl.

Exemplary acid labile groups on the dissolution regulator include groups of general formula (5) or (6) above, tertiary alkyl groups of 4 to 20 carbon atoms, trialkylsilyl groups in which each of the alkyls has 1 to 6 carbon atoms, and oxoalkyl groups of 4 to 20 carbon atoms.

The compound serving here as the dissolution regulator, in which phenolic hydroxyl groups have been partially substituted with acid labile groups, may be formulated in an amount of 0 to 50 parts, preferably 5 to 50 parts, and more preferably 10 to 30 parts, per 100 parts of the base resin, and may be used singly or as a mixture of two or more thereof.

An amount of less than 5 parts may fail to yield an improved resolution, whereas the use of more than 50 parts would lead to thinning of the patterned film, and thus a decline in resolution.

The dissolution regulators can be prepared by chemically reacting acid labile groups with a compound having phenolic hydroxyl groups in the same manner as described earlier for the base resin.

Instead of, or in addition to, the above-described dissolution regulator, the resist composition of the invention may include, as another dissolution regulator, a partially substituted compound having a weight average molecular weight of more than 1,000 and up to 3,000, and having phenolic hydroxyl groups on the molecule, in which an average of at least 0% but not more than 60% of all the hydrogen atoms on the phenolic hydroxyl groups have been substituted with acid labile groups.

The compound in which the phenolic hydroxyl group hydrogens are partially substituted with these acid labile groups is preferably one or more selected from among compounds having recurring units of general formula (28) below and a weight average molecular weight of more than 1,000 and up to 3,000.

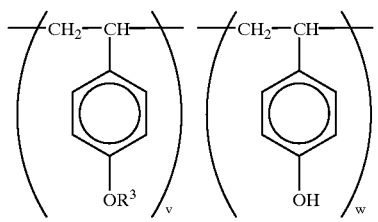

(28)

In the formula, $R^3$ is an acid labile group, and v and w are respectively numbers satisfying $0 \leq v/(v+w) \leq 0.6$.

Suitable examples of the acid labile groups in the other dissolution regulator include groups of general formula (5) or (6), tertiary alkyl groups of 4 to 20 carbon atoms, trialkylsilyl groups in which each of the alkyls has 1 to 6 carbon atoms, and oxoalkyl groups of 4 to 20 carbon atoms.

Advantageously, the other dissolution regulator just described is formulated in an amount such that the total amount of dissolution regulator, including the dissolution regulator described earlier, is 0 to 50 parts, preferably 0 to 30 parts, and more preferably at least 1 part, per 100 parts of the base resin.

This other dissolution regulator can be prepared by chemically reacting acid labile groups with a compound having phenolic hydroxyl groups in the same manner as described earlier for the base resin.

The resist composition of the invention may further include an UV absorber of component (H) which is typically a compound having a molar absorbance of not more than 10,000 at a wavelength of 248 nm. The inclusion of the UV absorber allows the resist composition to be designed and controlled to have a suitable transmittance for substrates of differing reflectances.

Illustrative examples of this compound include fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, pleiadene, picene, perylene, pentaphene, pentacene, benzophenanthrene, anthraquinone, anthrone, benzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and the compounds of general formulas (29) and (30) below; fused heterocyclic derivatives such as thioxanthene-9-one, thianthrene, and dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)benzophenone; and squaric acid derivatives such as squaric acid and dimethyl squarate.

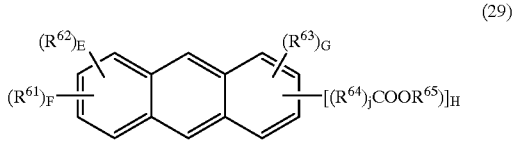

(29)

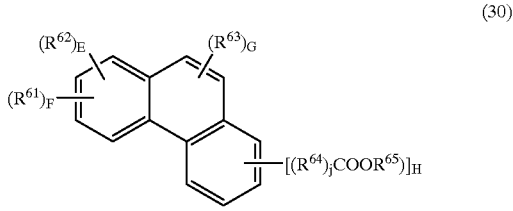

(30)

In the formulas, $R^{61}$ to $R^{63}$ are independently hydrogen, straight or branched alkyl, straight or branched alkoxy, straight or branched alkoxyalkyl, straight or branched alkenyl, or aryl. $R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. Also, $R^{65}$ is an acid labile group; the letter J is 0 or 1; E, F, and G are each 0 or integers from 1 to 9; H is a positive integer from 1 to 10; and $E+F+G+H \leq 10$.

More particularly, in above formulas (29) and (30), $R^{61}$ to $R^{63}$ are independently hydrogen, straight or branched alkyl, straight or branched alkoxy, straight or branched alkoxyalkyl, straight or branched alkenyl, or aryl. Preferable examples of the straight or branched alkyl groups include those having 1 to 10 carbon atoms, such as methyl, ethyl, n-propyl, isopropyl, n-butyl, sec-butyl, tert-butyl, hexyl, cyclohexyl, and adamantyl; of these, the use of methyl, ethyl, isopropyl, or tert-butyl is especially preferred. Preferable examples of straight or branched alkoxy groups include those having 1 to 8 carbon atoms, such as methoxy, ethoxy, propoxy, isopropoxy, n-butoxy, sec-butoxy, tert-butoxy, hexyloxy, and cyclohexyloxy; of these, the use of methoxy, ethoxy, isopropoxy, and tert-butoxy is especially preferred. Preferable examples of the straight or branched alkoxyalkyl groups include those having 2 to 10 carbon atoms, such as methoxymethyl, 1-ethoxyethyl, 1-ethoxypropyl, 1-propoxyethyl, and tert-butoxyethyl; of these, the use of methoxymethyl, 1-ethoxyethyl, 1-ethoxypropyl, and 1-propoxyethyl is especially preferred. Preferable examples of the straight or branched alkenyl groups include those having 2 to 4 carbon atoms, such as vinyl, propenyl, allyl, and butenyl. Preferable examples of the aryl groups include those having 6 to 14 carbon atoms, such as phenyl, xylyl, toluyl, and cumenyl.

$R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom; and J in the formula is 0 or 1. When J is 0, the —$R^{64}$— linkage is a single bond.

Preferable examples of substituted or unsubstituted divalent aliphatic hydrocarbon groups which may contain an oxygen atom include those having 1 to 10 carbon atoms, such as methylene, ethylene, n-propylene, isopropylene, n-butylene, sec-butylene, —CH$_2$O—, —CH$_2$CH$_2$O—, and —CH$_2$OCH$_2$—. Of these, methylene, ethylene, —CH$_2$O—, and —CH$_2$CH$_2$O— are preferable.

Preferable examples of substituted or unsubstituted divalent alicyclic hydrocarbon groups which may contain an oxygen atom include those having 5 to 10 carbon atoms, such as 1,4-cyclohexylene, 2-oxacyclohexan-1,4-ylene, and 2-thiacyclohexan-1,4-ylene.

Preferable examples of substituted or unsubstituted divalent aromatic hydrocarbon groups which may contain an oxygen atom include those having 6 to 14 carbon atoms, such as o-phenylene, p-phenylene, 1,2-xylen-3,6-ylene, toluen-2,5-ylene, and 1-cumen-2,5-ylene; and allylalkylene groups having 6 to 14 carbon atoms, such as —CH$_2$Ph—, —CH$_2$PhCH$_2$—, —CH$_2$Ph—, and —OCH$_2$PhCH$_2$O— (wherein Ph stands for phenylene).

$R^{65}$ is an acid labile group, the term "acid labile group" referring here to a moiety in which a carboxyl group has been substituted with one or more functional groups cleavable in the presence of an acid. This may be any moiety which cleaves in the presence of an acid to liberate an alkali-soluble functional group, although moieties having general formula (31a), (31b), or (31c) below are preferred.

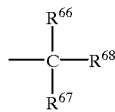

(31a)

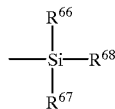

(31b)

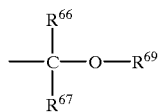

(31c)

In the formulas, $R^{66}$ to $R^{69}$ are independently hydrogen or a straight or branched alkyl, straight or branched alkoxy, straight or branched alkoxyalkyl, straight or branched alkenyl, or aryl, any of which groups may have a carbonyl on the chain thereof, provided that $R^{66}$ to $R^{69}$ are not all hydrogen. $R^{66}$ and $R^{67}$ may bond together to form a ring. $R^{69}$ is a straight or branched alkyl, straight or branched alkoxyalkyl, straight or branched alkenyl, or aryl, any of which may have a carbonyl on the chain thereof. $R^{69}$ may bond with $R^{66}$ to form a ring.

These straight or branched alkyl, straight or branched alkoxy, straight or branched alkoxyalkyl, straight or branched alkenyl, and aryl groups are exemplified by the same groups mentioned above for $R^{61}$ to $R^{63}$.

Examples of rings formed by the combination of $R^{66}$ and $R^{67}$ in formula (31a) include those having 4 to 10 carbon atoms, such as cyclohexylidene, cyclopentylidene, 3-oxocyclohexylidene, 3-oxo-4-oxacyclohexylidene, and 4-methylcyclohexylidene.

Examples of rings formed by the combination of $R^{66}$ and $R^{67}$ in formula (31b) include those having 3 to 9 carbon atoms, such as 1-silachlorohexylidene, 1-silacyclopentylidene, 3-oxo-1-silacyclopentylidene, and 4-methyl-1-silacyclopentylidene.

Examples of rings formed by the combination of $R^{69}$ and $R^{66}$ in formula (31c) include those having 4 to 10 carbon atoms, such as 2-oxacyclohexylidene, 2-oxacyclopentylidene, and 2-oxa-4-methylcyclohexylidene.

Exemplary groups represented by the formula (31a) include tertiary alkyl groups having 4 to 10 carbon atoms, such as tert-amyl, 1,1-dimethylethyl, 1,1-dimethylbutyl, 1-ethyl-1-methylpropyl, and 1,1-diethylpropyl; and 3-oxoalkyl groups, such as 1,1-dimethyl-3-oxobutyl, 3-oxocyclohexyl, and 1-methyl-3-oxo-4-oxacyclohexyl.

Exemplary groups represented by the formula (31b) include trialkylsilyl groups having 3 to 10 carbon atoms, such as trimethylsilyl, ethyldimethylsilyl, dimethylpropylsilyl, diethylmethylsilyl, triethylsilyl, and tert-butyldimethylsilyl.

Exemplary groups represented by the formula (31c) include groups having 2 to 8 carbon atoms, such as 1-methoxymethyl, 1-methoxyethyl, 1-ethoxyethyl, 1-ethoxypropyl, 1-ethoxyisobutyl, 1-n-propoxyethyl, 1-tert-butoxyethyl, 1-n-butoxyethyl, 1-isobutoxyethyl, 1-tert-pentoxyethyl, 1-cyclohexyloxyethyl, 1-(2'-n-butoxyethoxy)ethyl, 1-(2-ethylhexyloxy)ethyl, 1-{4-(acetoxymethyl)cyclohexylmethyloxy}ethyl, 1-{4-(tert-butoxycarbonyloxymethyl)cyclohexylmethyloxy}ethyl, 1-methoxy-1-methylethyl, 1-ethoxypropyl, dimethoxymethyl, diethoxymethyl, 2-tetrahydrofuranyl, and 2-tetrahydropyranyl.

In above formulas (29) and (30), E, F and G are each 0 or positive integers from 1 to 9, and H is a positive integer from 1 to 10, so as to satisfy E+F+G+H≦10.

Preferable examples of compounds represented by formulas (29) and (30) include the compounds shown in formulas (32a) to (32j) below.

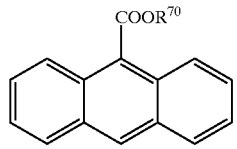

(32a)

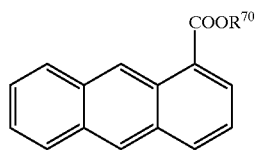

(32b)

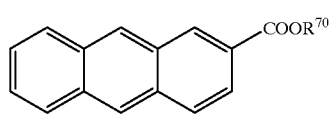

(32c)

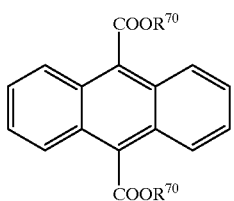

(32d)

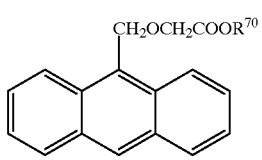

(32e)

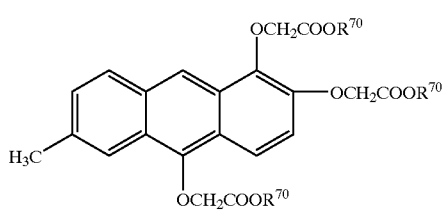

(32f)

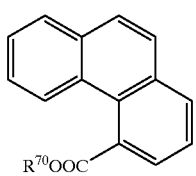

(32g)

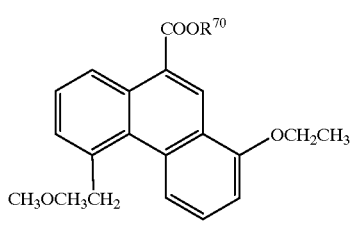

(32h)

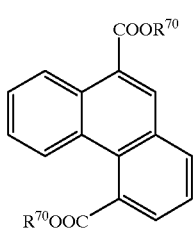

(32i)

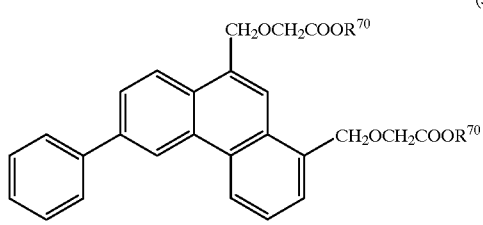

(32j)

In these formulas, $R^{70}$ is an acid labile group.

Examples of compounds which may be used as the UV absorber include also diarylsulfoxide derivatives such as bis(4-hydroxyphenyl)sulfoxide, bis(4-tert-butoxyphenyl)sulfoxide, bis(4-tert-butoxycarbonyloxyphenyl)sulfoxide, and bis[4-(1-ethoxyethoxy)phenyl]sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl]sulfone; diazo compounds such as benzoquinonediazide, naphthoquinonediazide, anthraquinonediazide, diazofluorene, diazotetralone, and diazophenanthrone; and quinonediazide group-containing compounds such as the complete or partial ester compounds of naphthoquinone-1,2-diazide-5-sulfonate chloride with 2,3,4-trihydroxybenzophenone, and the complete or partial ester compounds of 2-diazide-4-sulfonate chloride with 2,4,4'-trihydroxybenzophenone.

Preferable examples of the UV absorber include tert-butyl 9-anthracenecarboxylate, tert-amyl 9-anthracenecarboxylate, tert-methoxymethyl 9-anthracenecarboxylate, tert-ethoxyethyl 9-anthracenecarboxylate, tert-tetrahydropyranyl 9-anthracenecarboxylate, tert-tetrahydrofuranyl 9-anthracenecarboxylate, and partial ester compounds of naphthoquinone-1,2-diazide-5-sulfonate chloride with 2,3,4-trihydroxybenzophenone.

The UV absorber used as component (H) is included in an amount of preferably 0 to 10 parts, more preferably 0.5 to 10 parts, and even more preferably 1 to 5 parts, per 100 parts of the base resin.

The resist composition of the invention may additionally include, as component (I), an acetylene alcohol derivative for the purpose of enhancing the shelf stability.

Examples of compounds preferred for use as the acetylene alcohol derivative include those having general formula (33) or (34) below.

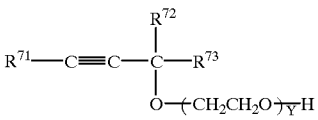

(33)

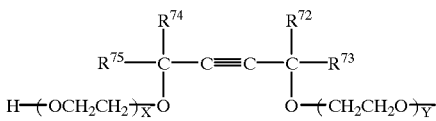

(34)

In the formulas, $R^{71}$, $R^{72}$, $R^{73}$, $R^{74}$, and $R^{75}$ are each hydrogen or a straight, branched, or cyclic alkyl of 1 to 8 carbon atoms; and X and Y are each 0 or a positive integer, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Olfin E1004 from Nisshin Chemical Industry K.K.

The acetylene alcohol derivative is added in an amount of preferably 0.01 to 2% by weight, and more preferably 0.02 to 1% by weight, per 100% by weight of the resist composition. Less than 0.01 by weight would be ineffective for improving coating characteristics and shelf stability, whereas more than 2% by weight would result in a resist having a low resolution.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megafac F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.5 to 2.0 μm, which is then pre-baked on a hot plate at 60 to 150° C. for 1 to 10 minutes, and preferably at 80 to 120° C. for 1 to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 1 to 5 minutes, and preferably at 80 to 120° C. for 1 to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 193 to 254 nm, an excimer laser, x-rays, or an electron beam. The desired pattern may not be obtainable outside the upper and lower limits of the above range.

The resist composition of the invention is sensitive to high-energy radiation, has excellent sensitivity, resolution, and plasma etching resistance, and provides a resist pattern of outstanding thermal stability and reproducibility. Moreover, the resulting pattern is less prone to overhang formation and has an excellent dimensional controllability. The additional formulation of an acetylene alcohol derivative improves shelf stability. Because these features of the inventive resist composition enable its use particularly as a resist having a low absorption at the exposure wavelength of a KrF excimer laser, a finely defined pattern having sidewalls perpendicular to the substrate can easily be formed, making the resist ideal as a micropatterning material in VLSI fabrication.

EXAMPLE

The following synthesis examples, examples of the invention, and comparative examples are provided to illustrate the invention, and are not intended to limit the scope thereof.

Synthesis Example 1

In a 2-liter flask, 100 g of polyhydroxystyrene was dissolved in 1,000 ml of dimethylformamide, and a catalytic amount of p-toluenesulfonic acid was added. Next, while stirring the flask contents at 20° C., 30 g of ethyl vinyl ether and 2 g of triethylene glycol divinyl ether were added. After one hour of reaction, the system was neutralized with concentrated ammonia water, and the neutralized reaction mixture was added dropwise to 10 liters of water, giving a white solid. The solid was collected by filtration, then dissolved in 500 ml of acetone, added dropwise to 10 liters of water, then collected again by filtration and vacuum dried. $^1$H-NMR analysis of the resulting polymer (Polym. 1) confirmed that 27% of the hydrogen atoms on the hydroxyl groups in the polyhydroxystyrene had been ethoxyethylated, and 3% had been crosslinked.

Synthesis Example 2

In a 2-liter flask, 100 ng of polyhydroxystyrene was dissolved in 1,000 ml of dimethylformamide, and a catalytic amount of p-toluenesulfonic acid was added. Next, while stirring the flask contents at 20° C., 30 g of ethyl vinyl ether and 2 g of 1,4-divinyloxymethylcyclohexane were added. After one hour of reaction, the system was neutralized with concentrated ammonia water, and the neutralized reaction mixture was added dropwise to 10 liters of water, giving a white solid. The solid was collected by filtration, then dissolved in 500 ml of acetone, added dropwise to 10 liters of water, then collected again by filtration and vacuum dried. $^1$H-NMR analysis of the resulting polymer confirmed that 27% of the hydrogen atoms on the hydroxyl groups in the polyhydroxystyrene had been ethoxyethylated, and 3% had been crosslinked.

Next, 50 g of the partially crosslinked ethoxyethoxylated polyhydroxystyrene obtained was dissolved in 500 ml of pyridine, and 7 g of di-tert-butyl dicarbonate was added under stirring at 45° C. Following one hour of reaction, the reaction mixture was added dropwise to 3 liters of water, giving a white solid. The solid was collected by filtration, then dissolved in 50 ml of acetone, added dropwise to 2 liters of water, collected again by filtration, then vacuum dried to give the polymer. This polymer had the structure shown in the rational formula below (Polym. 2). $^1$H-NMR analysis of the resulting polymer confirmed that 27% of the hydrogen atoms on the hydroxyl groups in the polyhydroxystyrene had been ethoxyethylated, and 8% of the hydrogen atoms on the hydroxyl groups had been tert-butoxycarbonylated.

Synthesis Example 3

In a 2-liter flask, 50 g of polyhydroxystyrene was dissolved in 500 ml of dimethylformamide, and a catalytic amount of p-toluenesulfonic acid was added. Next, while stirring the flask contents at 20° C., 27 g of ethyl vinyl ether and 3 g of 1,4- divinyloxymethylcyclohexane were added. After one hour of reaction, the system was neutralized with concentrated ammonia water, and the neutralized reaction mixture was added dropwise to 10 liters of water, giving a white solid. The solid was collected by filtration, then dissolved in 500 ml of acetone, added dropwise to 10 liters of water, then collected again by filtration and vacuum dried. $^1$H-NMR analysis of the resulting polymer (Polym. 3) confirmed that 24% of the hydrogen atoms on the hydroxyl groups in the polyhydroxystyrene had been ethoxyethylated, and 100% had been crosslinked.

Synthesis Examples 4 to 7

Polymers having the rational formulas (Polym. 4 to 7) shown below were obtained by the same method as in Synthesis Examples 1 to 3.

Synthesis Example 8

In a 2-liter flask, long of polyhydroxystyrene was dissolved in 900 ml of tetrahydrofuran, and 3.9 g of methanesulfonic acid was added. This was followed by the addition of 28.2 g of ethyl 1-propenyl ether at 30° C. and under stirring. After 3 hours of reaction under the same conditions, 3.8 g of 1,4-butanediol divinyl ether was added, and the mixture was reacted for 0.5 hour, following which it was neutralized with concentrated ammonia water. The reaction mixture was subjected to a solvent exchange into ethyl acetate and was purified six times by liquid-liquid extraction using pure water and a small amount of acetone. This was followed by solvent exchange into acetone, then dropwise addition to 20 liters of pure water, yielding a white solid. The solid was collected by filtration, washed twice with pure water, then collected again by filtration and vacuum dried. $^1$H-NMR analysis of the resulting polymer (Polym. 8) confirmed that 26% of the hydrogen atoms on the hydroxyl groups in the polyhydroxystyrene had been ethoxypropoxylated, and 5.5% had been crosslinked.

Synthesis Examples 9 and 10

Polymers having the rational formulas (Polym. 9 and 10) shown below were obtained by the same method as in Synthesis Example 8.

Synthesis Example 11

In a 2-liter flask, 100 g of polyhydroxystyrene was dissolved in 900 ml of tetrahydrofuran, and 3.9 g of methanesulfonic acid was added. This was followed by the addition of 20.0 g of ethyl 1-propenyl ether at 30° C. and under stirring. After 3 hours of reaction under the same conditions, 3.8 g of 1,4-butanediol divinyl ether was added, and the mixture was reacted for 0.5 hour, following which it was neutralized with concentrated ammonia water. The reaction mixture was subjected to a solvent exchange into ethyl acetate and was purified six times by liquid-liquid extraction using pure water and a small amount of acetone. This was followed by solvent exchange into acetone, then dropwise addition to 20 liters of pure water, yielding a white solid. The solid was collected by filtration, washed twice with pure water, then collected again by filtration and vacuum dried.

Next, 50 g of the resulting partially crosslinked ethoxypropoxylated polyhydroxystyrene was dissolved in 300 ml of pyridine, and 4.5 g of di-tert-butyl dicarbonate was added under stirring at 40° C. Following one hour of reaction, the reaction mixture was added dropwise to 10 liters of water, giving a white solid. The solid was collected by filtration, then dissolved in 200 ml of acetone, added dropwise to 2 liters of water, then collected again by filtration and vacuum dried to give the polymer. This polymer had the structure shown in the rational formula below (Polymer 11). $^1$H-NMR analysis of the polymer confirmed that 21% of the hydrogen atoms on the hydroxyl groups in the polyhydroxystyrene had been ethoxypropoxylated, 5% had been tert-butoxycarbonylated, and 5.5% had been crosslinked.

Synthesis Example 12

In a 2-liter flask, 100 g of polyhydroxystyrene was dissolved in 900 ml of tetrahydrofuran, and 3.9 g of methanesulfonic acid was added. This was followed by the addition of 24.0 g of ethyl vinyl ether at 30° C. and under stirring. After 1 hour of reaction, 3.8 g of 1,4-butanediol divinyl ether was added, and the mixture was reacted for 0.5 hour, following which it was neutralized with concentrated ammonia water. The reaction mixture was subjected to a solvent exchange into ethyl acetate and was purified six times by liquid-liquid extraction using pure water This was followed by solvent exchange into acetone, then dropwise addition to 20 liters of pure water, yielding a white solid. The solid was collected by filtration, washed twice with pure water, then collected again by filtration and vacuum dried. $^1$H-NMR analysis of the resulting polymer (Polym. 12) confirmed that 31% of the hydrogen atoms on the hydroxyl groups in the polyhydroxystyrene had been ethoxyethylated and 5.5% had been crosslinked.

Synthesis Example 13

In a 2-liter flask, 100 g of polyhydroxystyrene was dissolved in 900 ml of tetrahydrofuran, and 3.9 g of methanesulfonic acid was added. This was followed by the addition of 16.4 g of ethyl vinyl ether at 30C and under stirring. After 1 hour of reaction, 3.8 g of 1,4-butanediol divinyl ether was added, and the mixture was reacted for 0.5 hour, following which it was neutralized with concentrated ammonia water. The reaction mixture was subjected to a solvent exchange into ethyl acetate and was purified six times by liquid-liquid extraction using pure water. This was followed by solvent exchange into acetone, then dropwise addition to 20 liters of pure water, yielding a white solid. The solid was collected by filtration, washed twice with pure water, then collected again by filtration and vacuum dried.

Next, 50 g of the partially crosslinked ethoxyethoxylated polyhydroxystyrene obtained was dissolved in 300 ml of pyridine, and 4.5 g of di-tert-butyl dicarbonate was added under stirring at 40° C. Following one hour of reaction, the reaction mixture was added dropwise to 10 liters of water, giving a white solid. The solid was collected by filtration, then dissolved in 200 ml of acetone, added dropwise to 2 liters of water, then collected again by filtration and vacuum dried to give the polymer. This polymer had the structure shown in the rational formula below (Polymer 13). $^1$H-NMR analysis of the polymer confirmed that 18.0% of the hydrogen atoms on the hydroxyl groups in the polyhydroxystyrene had been ethoxyethoxylated, 5% had been tert-butoxycarbonylated, and 5.5% had been crosslinked.

Synthesis Examples 14 and 15

Polymers having the rational formulas (Polym. 14 and 15) shown below were obtained by the same method as in Synthesis Example 11.

Synthesis Example 16

Aside from not using ethyl vinyl ether, a polymer having the rational formula (Polym. 16) shown below was obtained by the same method as in Synthesis Example 12.

Synthesis Example 17

Using poly(3,4-dihydroxystyrene) and an alkenyl ether compound (I-22), a polymer having the rational formula (Polym. 17) shown below was obtained by the same method as in Synthesis Example 13.

Synthesis Example 18

Using an alkenyl ether compound (II-1), a polymer having the rational formula (Polym. 18) shown below was obtained by the same method as in Synthesis Example 11.

Synthesis Example 19

A polymer having the rational formula (Polym. 19) shown below was obtained by the same method as in Synthesis Example 8.

The structures of the polymers obtained are shown in the rational formulas below. The respective degrees of substitution and weight average molecular weight are given in Table 1. In the formulas shown below, R is a crosslinking group which intermolecularly or intramolecularly crosslinks the $U_1$ or $U_2$ units shown below, and (R) indicates that the crosslinking group R is in a bonded state.

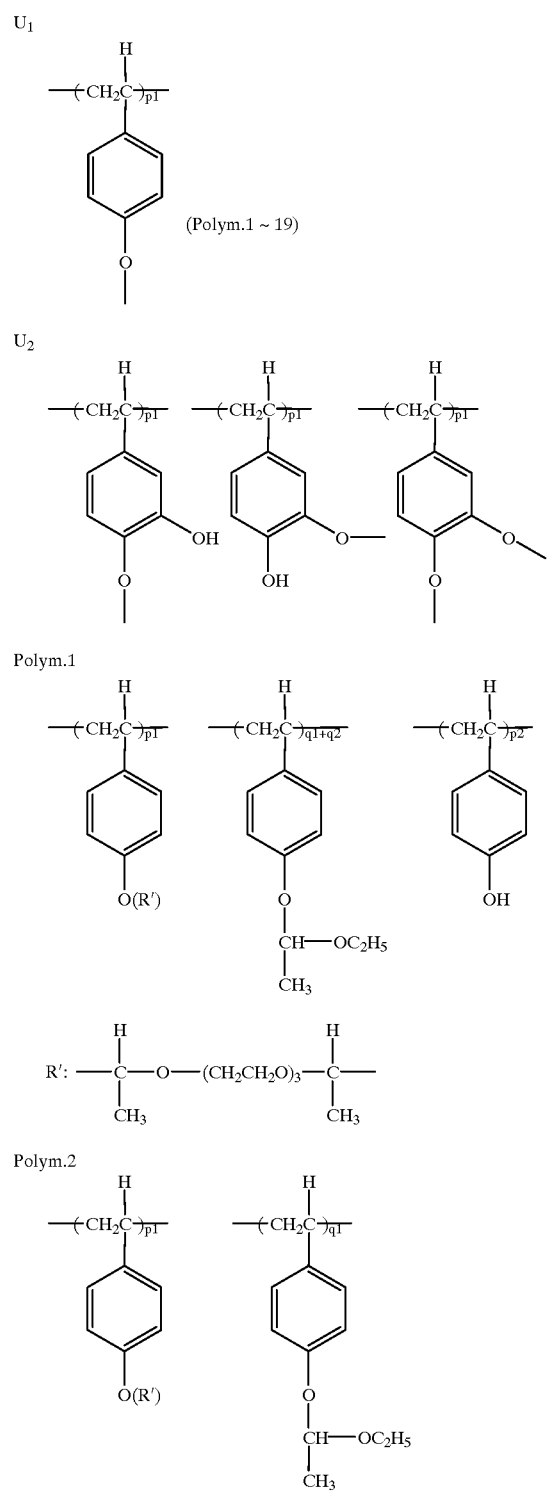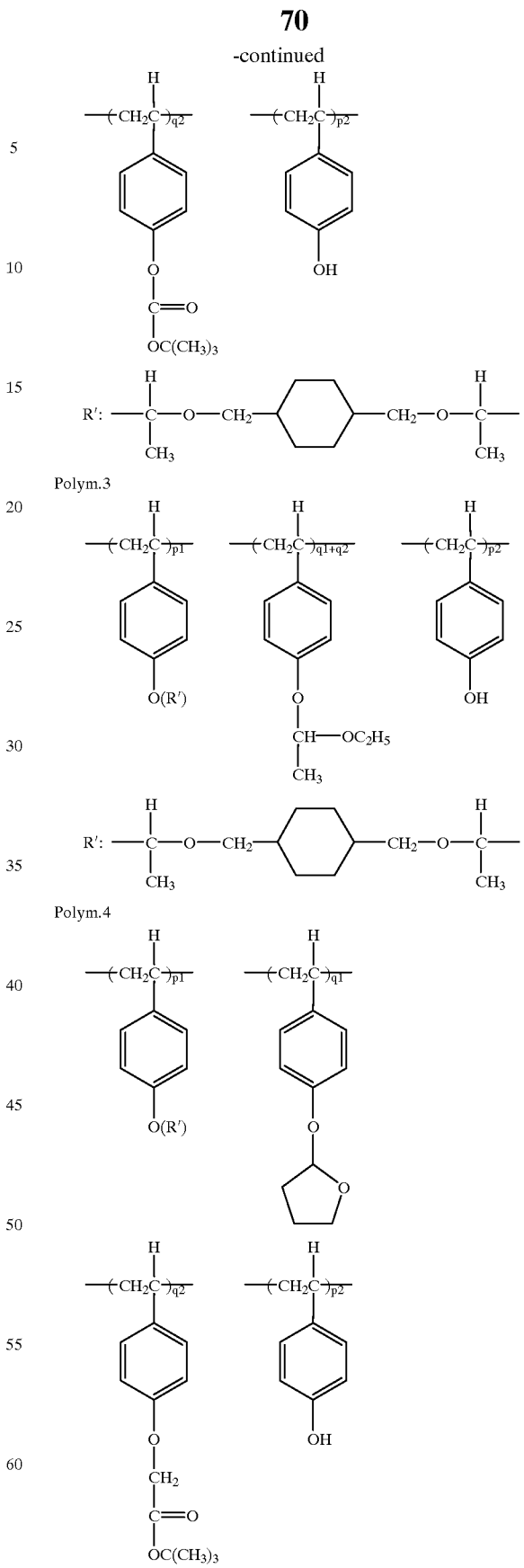

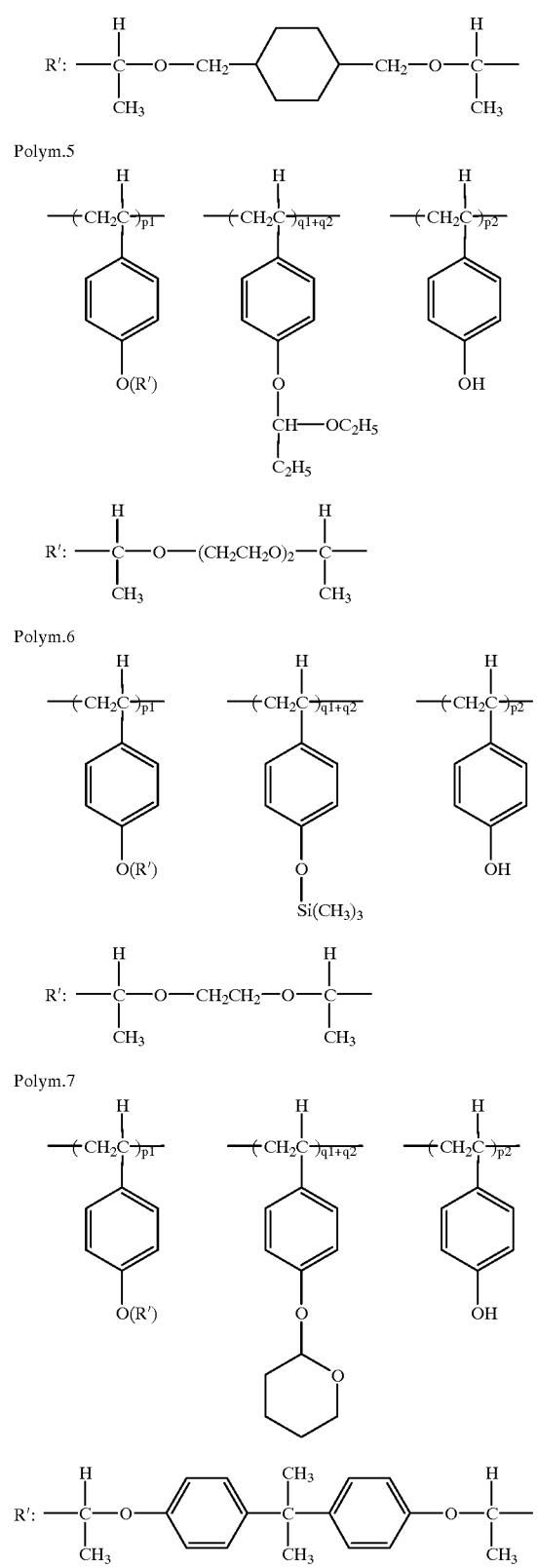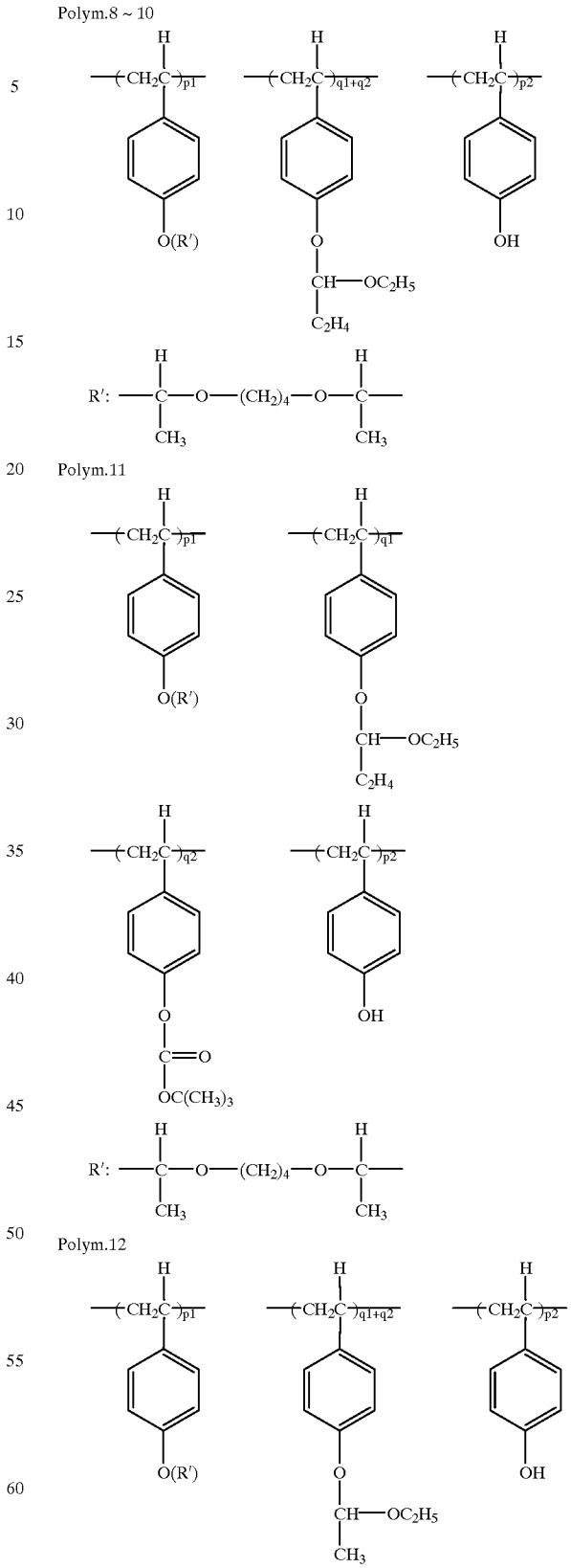

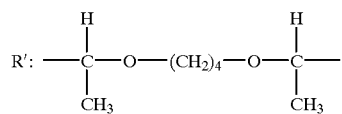
Polym.13 ~ 15
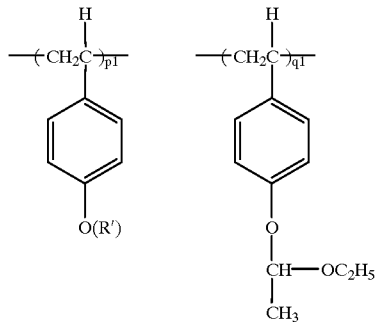
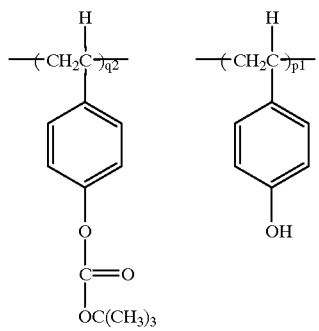
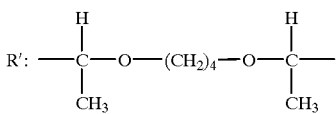
Polym.16
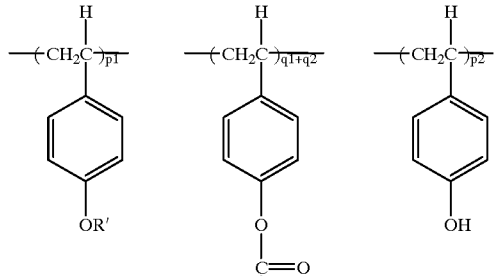
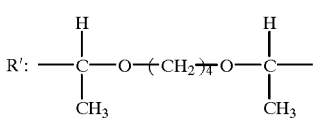
Polym.17
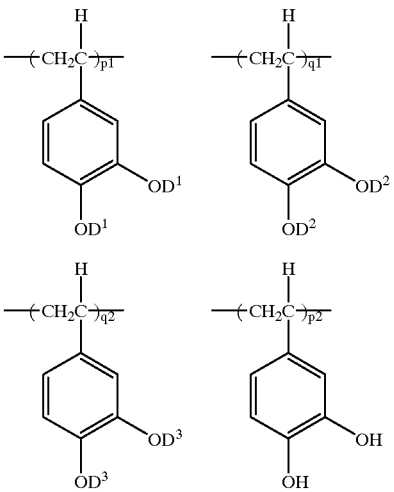
In the above formulas,
$D^1$ is H or (R'),
$D^2$ is H or —CH(C$_2$H$_5$)—OC$_2$H$_5$,
$D^3$ is H or —C(=O)—OC(CH$_3$)$_3$, and
R' is 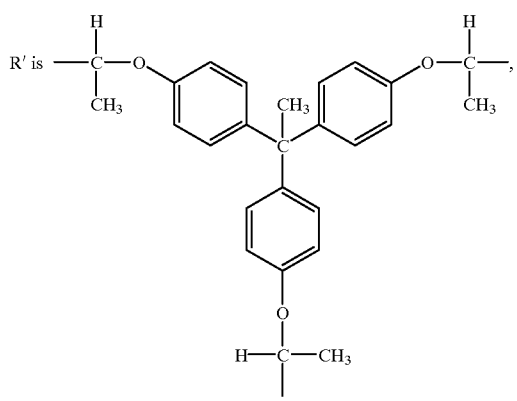
provided that at least one $D^1$ is R,
at least one $D^2$ is —CH(C$_2$H$_5$)—OC$_2$H$_5$
and at least one $D^3$ is —C(=O)—OC(CH$_3$)$_3$.

Polym.18

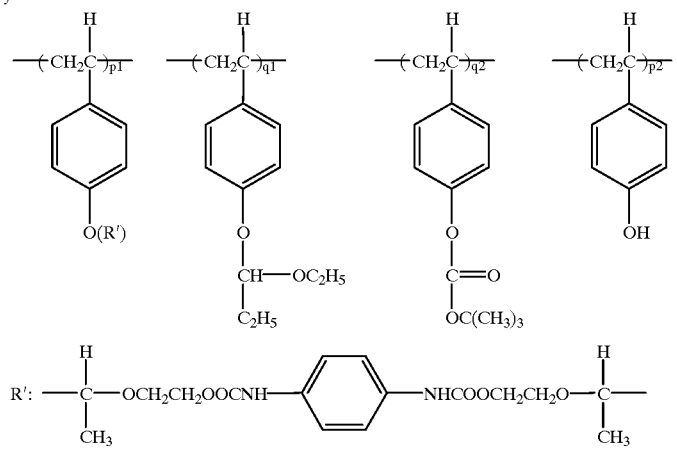

Polym.19

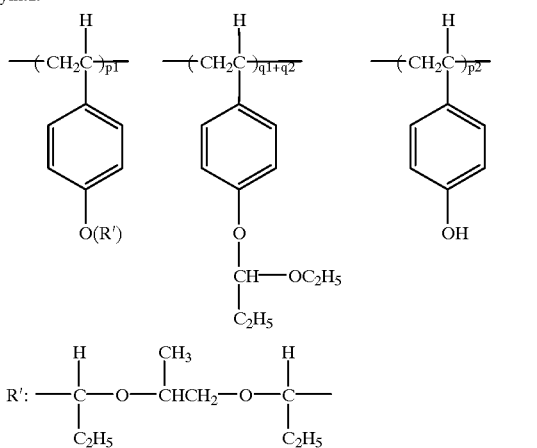

TABLE 1

| Synthesis example | Proportions (molar ratio) | | | | Mw of PHS* | Mw/Mn of PHS* | Mw of polymer |
|---|---|---|---|---|---|---|---|
| | p1 | q1 | q2 | p2 | | | |
| 1 [Polym. 1] | 3 | | 27 | 70 | 11,000 | 1.05 | 22,000 |
| 2 [Polym. 2] | 3 | 27 | 8 | 62 | 11,000 | 1.05 | 23,000 |
| 3 [Polym. 3] | 10 | | 24 | 66 | 5,000 | 1.05 | 12,000 |
| 4 [Polym. 4] | 7 | 10 | 5 | 78 | 5,000 | 1.05 | 12,000 |
| 5 [Polym. 5] | 4 | | 35 | 61 | 11,000 | 1.42 | 24,000 |
| 6 [Polym. 6] | 7 | | 25 | 68 | 13,000 | 1.15 | 30,000 |
| 7 [Polym. 7] | 10 | | 20 | 70 | 3,000 | 1.10 | 8,000 |
| 8 [Polym. 8] | 5.5 | | 26 | 68.5 | 11,000 | 1.05 | 22,000 |
| 9 [Polym. 9] | 5.5 | | 26 | 68.5 | 5,000 | 1.05 | 11,000 |
| 10 [Polym. 10] | 3.5 | | 28 | 69.0 | 11,000 | 1.05 | 19,000 |
| 11 [Polym. 11] | 5.5 | 21 | 5 | 68.5 | 11,000 | 1.05 | 24,000 |
| 12 [Polym. 12] | 5.5 | | 31 | 63.5 | 11,000 | 1.05 | 25,000 |
| 13 [Polym. 13] | 5.5 | 18 | 5 | 71.5 | 11,000 | 1.05 | 24,000 |
| 14 [Polym. 14] | 0.25 | 14 | 14 | 71.75 | 10,000 | 1.05 | 14,000 |
| 15 [Polym. 15] | 1 | 20 | 14 | 65 | 6,000 | 1.15 | 9,000 |
| 16 [Polym. 16] | 4 | | 18 | 78 | 10,000 | 1.08 | 23,000 |
| 17 [Polym. 17] | 4 | 20 | 4 | 72 | 10,000 | 1.20 | 25,000 |
| 18 [Polym. 18] | 2 | 21 | 5 | 71 | 10,000 | 1.30 | 27,000 |
| 19 [Polym. 19] | 5 | | 24 | 71 | 10,000 | 1.10 | 25,000 |

*Polyhydroxystyrene

Examples and Comparative Examples

Resist components selected from among the polymers obtained in the foregoing synthesis examples (Polym. 1 to 19) as the base resin, the photoacid generators of the formulas given below (PAG 1 to 14), dissolution regulators designated below as DRR 1 to 4, basic compounds, aromatic compounds bearing a ≡C—COOH group within the molecule and having the formulas given below (ACC 1 and 2), and UV absorbers of the formulas given below (DYE 1 and 2) were dissolved in a solvent, and prepared into liquid resist compositions having the proportions shown in Tables 2 and 3. Where needed, 0.1 part of the surfactant Florade FC-430 from Sumitomo 3M Ltd. was added to improve film formability.

For the sake of comparison, liquid resist compositions having the proportions shown in Table 4 were similarly prepared using the polymers of the rational formulas given below (Polym. 20 to 22) as the base resin.

These compositions were each passed through a 0.1 μm Teflon filter to give the finished resist solution. This resist solution was spin-coated onto a silicon wafer, following which the coated silicon wafer was baked on a hot plate at 100° C. for 90 seconds. The thickness of the resist film was set at 0.55 μm.

The resist film was exposed through a patterning mask having the desired pattern using an excimer laser stepper (NSR-2005EX, from Nikon Corporation; NA=0.5), then baked at 110° C. for 90 seconds and developed for 60 seconds with a 2.38% solution of tetramethylammonium hydroxide in water, thereby giving a positive pattern.

The resist patterns obtained were evaluated as described below.

First, the sensitivity (Eth) was determined. Next, the optimal dose (sensitivity: Eop) was defined as the dose which provides a 1:1 resolution at the top and bottom of a 0.24 μm line-and-space pattern, and the resolution of the resist under evaluation was defined as the minimum line width of the lines and spaces that separated at this dose. The shape of the resolved resist pattern was examined under a scanning electron microscope. The thermal stability test was carried out by heating this resist pattern on a hot plate at 130° C. for 10 minutes, and examining the change in the pattern shape before and after heating.

Adhesion to the substrate was evaluated by determining whether any of the resist pattern collapsed at the peripheral edge of an 8-inch wafer.

The resist compositions are shown in Tables 2 to 5, the evaluation results in Examples are shown in Table 6, and the evaluation results in Comparative Examples are shown in Table 7.

(PAG.1)

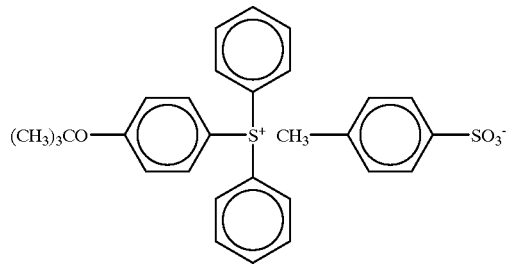

(PAG.2)

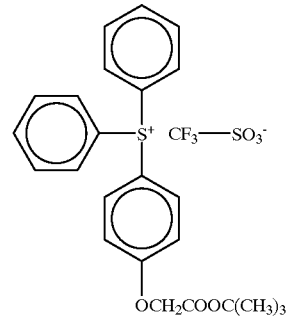

(PAG.3)

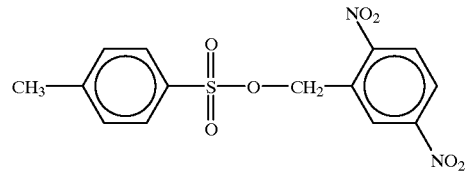

(PAG.4)

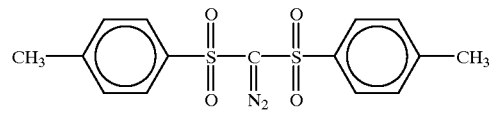

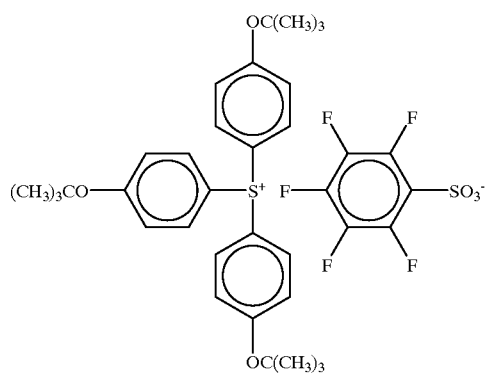
(PAG.5)
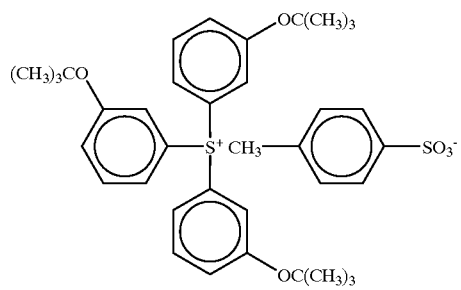
(PAG.6)
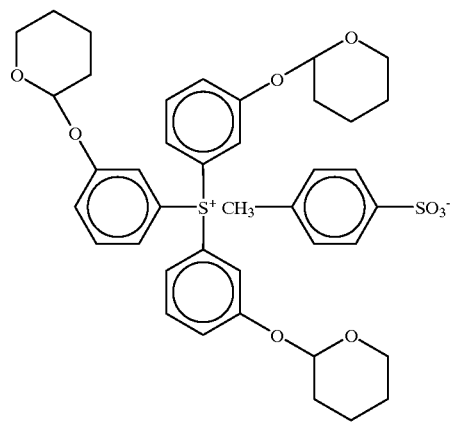
(PAG.7)
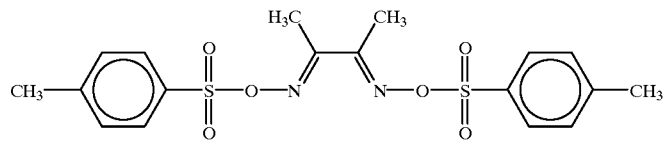
(PAG.8)

-continued
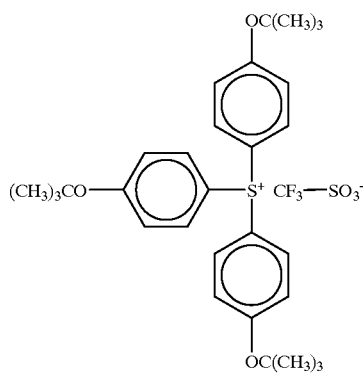
(PAG.9)
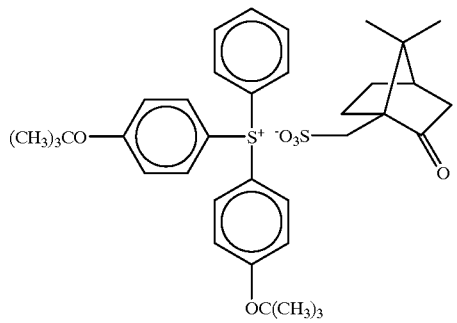
(PAG.10)
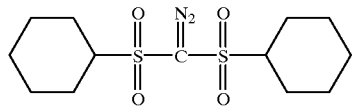
(PAG.11)
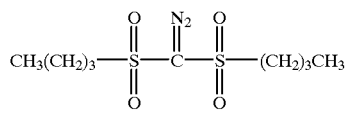
(PAG.12)
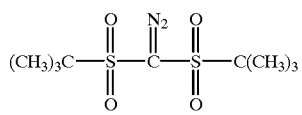
(PAG.13)
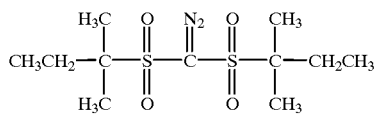
(PAG.14)
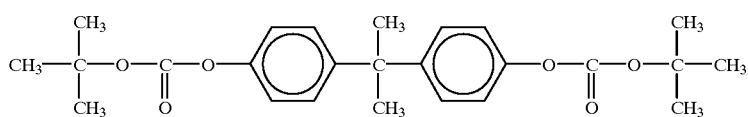
(DRR.1)
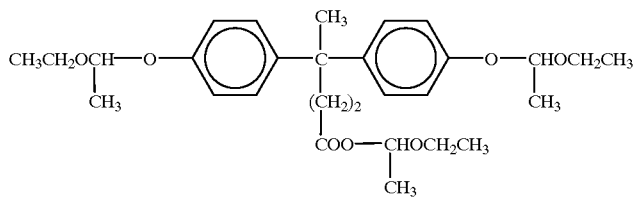
(DRR.2)

(DRR.3)
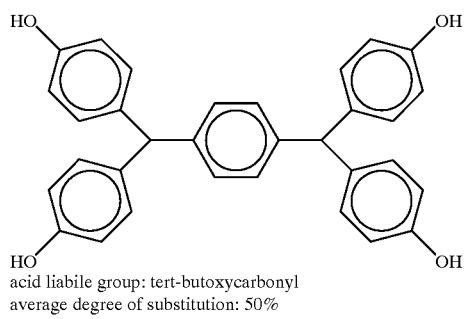
acid liabile group: tert-butoxycarbonyl
average degree of substitution: 50%
(DRR.4)
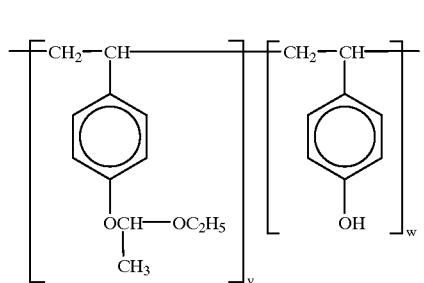
$v/(v + w) = 0.09$
weight averageo molecular weight: 3,000
(ACC.1)
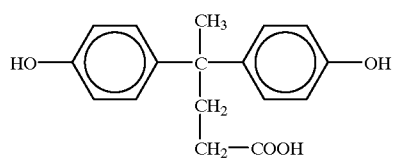
(ACC.2)
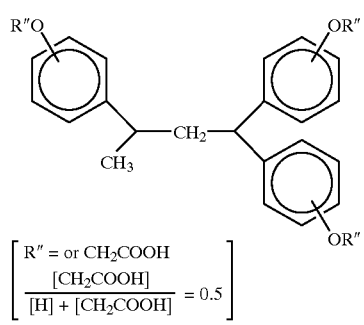
$$\left[ \begin{array}{c} R'' = \text{or } CH_2COOH \\ \dfrac{[CH_2COOH]}{[H] + [CH_2COOH]} = 0.5 \end{array} \right]$$
(DYE.1)
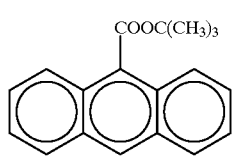

-continued
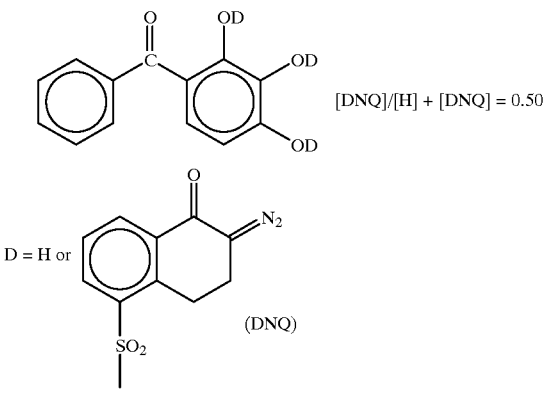
[DNQ]/[H] + [DNQ] = 0.50
D = H or (DNQ)
(DYE.2)
Polym.20
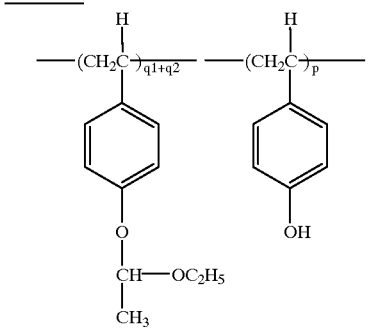
Mw = 12,000
Mw/Mn = 2.0
q1 + q2/(q1 + q2 + p) = 0.35
Polym.21
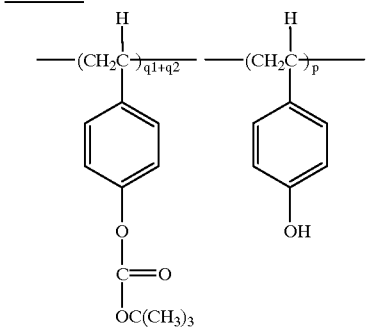
Mw = 15,000
Mw/Mn = 1.5
q1 + q2/(q1 + q2 + p) = 0.20
Polym.22
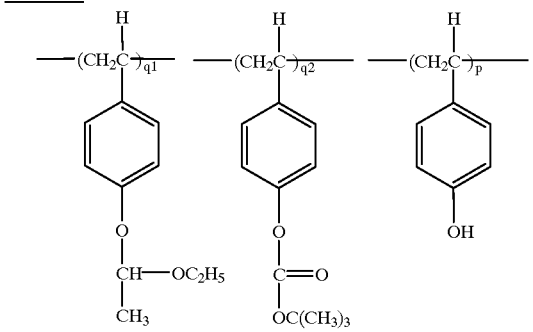
Mw = 12,000
Mw/Mn = 1.1
q1/(q1 + q2 + p) = 0.24
q1/(q1 + q2 + p) = 0.08

TABLE 2

Resist composition (proportions in parts by weight appear in parentheses)

| Example | Base resin | Photoacid generator | Dissolution regulator | Basic compound | Other additives | Organic solvent |
|---|---|---|---|---|---|---|
| 1 | Polym. 1 (56) Polym. 14 (24) | PAG. 1 (3) | — | N,N-Diethylethanolamine (0.1) | ACC. 1 (0.2) | PGMEA (530) |
| 2 | Polym. 2 (40) Polym. 3 (40) | PAG. 2 (3) | — | N-Ethyldiethanolamine (0.1) | ACC. 1 (0.2) | PGMEA (530) |
| 3 | Polym. 3 (56) Polym. 15 (24) | PAG. 3 (3) | — | N-Methylpyrrolidone (0.1) | ACC. 1 (0.2) | DGLM (300) |
| 4 | Polym. 4 (40) Polym. 10 (40) | PAG. 4 (3) | — | Triethanolamine (0.1) | ACC. 1 (0.2) | PGMEA (530) |
| 5 | Polym. 5 (56) Polym. 9 (24) | PAG. 5 (3) | — | 2-Hydroxypyridine (0.11) | ACC. 1 (0.2) | PGMEA (530) |
| 6 | Polym. 6 (56) Polym. 9 (24) | PAG. 6 (3) | DRR. 1 (16) | N,N,N',N'-Tetramethylethylene-diamine (0.09) | ACC. 1 (0.2) | PGMEA (530) |
| 7 | Polym. 7 (10) Polym. 8 (70) | PAG. 1 (1) PAG. 8 (2) | DRR. 3 (16) | Triethanolamine (0.09) | ACC. 1 (0.2) | EIPA (580) |
| 8 | Polym. 8 (56) Polym. 9 (24) | PAG. 1 (1) PAG. 11 (2.5) | — | Triethanolamine (0.1) Piperidine ethanol (0.05) | ACC. 1 (0.2) | PGMEA (530) |
| 9 | Polym. 11 (70) Polym. 14 (10) | PAG. 1 (1) PAG. 12 (2) | — | Triethanolamine (0.1) 1,8-Diazabicycloundecane | ACC. 1 (0.5) | PGMEA (530) |
| 10 | Polym. 12 (60) Polym. 14 (20) | PAG. 9 (2) PAG. 7 (1) | DRR. 2 (8) | N-Methylpyrrolidone (0.1) | ACC. 1 (0.2) | EL/BA (510) |
| 11 | Polym. 13 (70) Polym. 14 (10) | PAG. 9 (2) PAG. 10 (1) | DRR. 4 (8) | N,N-Dimethylacetamide (5.0) | ACC. 1 (0.2) | EL/BA (510) |
| 12 | Polym. 16 (40) Polym. 12 (20) Polym. 15 (20) | PAG. 1 (4) | — | Tributylamine (0.03) N,N-Dimethylacetamide (5.0) | ACC. 1 (0.2) | PGMEA (530) |
| 13 | Polym. 17 (40) Polym. 12 (20) Polym. 15 (20) | PAG. 1 (4) | DRR. 2 (4) | 2-Hydroxypyridine (0.11) | ACC. 2 (2) | PGMEA (530) |

TABLE 3

Resist composition (proportions in parts by weight appear in parentheses)

| Example | Base resin | Photoacid generator | Dissolution regulator | Basic compound | Other additives | Organic solvent |
|---|---|---|---|---|---|---|
| 14 | Polym. 11 (30) Polym. 20 (30) Polym. 14 (20) | PAG. 9 (4) | — | Triethanolamine (0.1) | ACC. 1 (1) | PGMEA (530) |
| 15 | Polym. 8 (50) | PAG. 1 (1) | — | Triethanolamine (0.05) | ACC. 1 (0.2) | PGMEA (530) |

TABLE 3-continued

| | Resist composition (proportions in parts by weight appear in parentheses) | | | | | |
|---|---|---|---|---|---|---|
| Example | Base resin | Photoacid generator | Dissolution regulator | Basic compound | Other additives | Organic solvent |
| | Polym. 10 (30) | PAG. 11 (2.5) | | | DYE. 1 (1.2) | |
| 16 | Polym. 11 (24) | PAG. 1 (1) | — | Piperidine ethanol (0.05) | ACC. 1 (0.2) | PGMEA (530) |
| | Polym. 14 (56) | PAG. 11 (2.5) | | | DYE. 2 (4) | |
| 17 | Polym. 12 (60) | PAG. 1 (1) | — | Triethanolamine (0.05) | ACC. 1 (0.2) | PGMEA (530) |
| | Polym. 10 (20) | PAG. 12 (2) | | | DYE. 1 (1.2) | |
| 18 | Polym. 13 (70) | PAG. 1 (1) | — | Piperidine ethanol (0.05) | ACC. 1 (0.2) | PGMEA (530) |
| | Polym. 15 (10) | PAG. 12 (2) | DYE. 1 (4) | | | |
| 19 | Polym. 1 (70) | PAG. 1 (2) | DRR. 3 (4) | N-Methylpyrrolidone (0.05) | ACC. 1 (0.2) | PGMEA/EP (530) |
| | Polym. 14 (10) | | DRR. 2 (4) | | | |
| 20 | Polym. 1 (70) | PAG. 1 (2) | DRR. 4 (4) | N-Methylpyrrolidone (0.05) | ACC. 1 (0.2) | PGMEA/CH (530) |
| | Polym. 14 (10) | | | | | |
| 21 | Polym. 2 (60) | PAG. 1 (2) | — | N-Methylpyrrolidone (0.05) | ACC. 1 (0.2) | PGMEA (530) |
| | Polym. 14 (20) | | | | | |
| 22 | Polym. 2 (60) | PAG. 1 (2) | — | N-Methylpyrrolidone (0.05) | ACC. 1 (0.2) | PGMEA (530) |
| | Polym. 14 (20) | | | | | |
| 23 | Polym. 21 (8) | PAG. 1 (1.5) | — | Triethanolamine (0.08) | ACC. 1 (0.2) | PGMEA/EL (530) |
| | Polym. 16 (62) | | | | | |
| | Polym. 14 (10) | | | | | |
| 24 | Polym. 17 (70) | PAG. 1 (1.5) | — | Triethanolamine (0.08) | ACC. 1 (0.2) | PGMEA/EL (530) |
| | Polym. 15 (10) | | | | | |

TABLE 4

| | Resist composition (proportions in parts by weight appear in parentheses) | | | | | |
|---|---|---|---|---|---|---|
| Example | Base resin | Photoacid generator | Dissolution regulator | Basic compound | Other additives | Organic solvent |
| 25 | Polym. 19 (70) | PAG. 2 (4) | — | N,N-Dimethylacetamide (1.0) | ACC. 1 (2) | PGMEA/EL (530) |
| | Polym. 15 (10) | | | | | |
| 26 | Polym. 8 (24) | PAG. 1 (1) | — | Triethanolamine (0.2) | ACC. 1 (1) | PGMEA/EL (530) |
| | Polym. 14 (56) | PAG. 11 (2.4) | | | | |
| 27 | Polym. 8 (24) | PAG. 4 (5) | — | Triethanolamine (0.5) | ACC. 1 (1) | PGMEA/EL (530) |
| | Polym. 14 (56) | PAG. 11 (2.4) | | | | |
| 28 | Polym. 8 (24) | PAG. 4 (5) | — | Tris{2-(2-methoxymethoxy)ethyl}amine (1) | ACC. 1 (1) | PGMEA/EL (530) |
| | Polym. 14 (56) | PAG. 13 (2) | | | | |
| 29 | Polym. 19 (40) | PAG. 1 (0.25) | — | Tris{2-(2-methoxyethoxy)ethyl}amine (1) | ACC. 1 (1) | PGMEA/EL (530) |
| | Polym. 15 (40) | PAG. 4 (4.5) | | | | |
| | | PAG. 14 (2) | | | | |

TABLE 5

| Comparative Example | Base resin | Photoacid generator | Dissolution regulator | Basic compound | Other additives | Organic solvent |
|---|---|---|---|---|---|---|
| 1 | Polym. 20 (80) | PAG. 1 (2) | — | N-Methylpyrrolidone (0.05) | ACC. 1 (0.2) | PGMEA/EL (530) |
| 2 | Polym. 21 (80) | PAG. 1 (2) | — | Triethanolamine (0.08) | ACC. 1 (0.2) | PGMEA/EL (530) |
| 3 | Polym. 22 (80) | PAG. 1 (2) | — | N-Methylpyrrolidone (0.05) | ACC. 1 (0.2) | PGMEA/EL (530) |
| 4 | Polym. 1 (80) | PAG. 1 (3) | — | N,N-Diethylethanolamine (0.1) | ACC. 1 (0.2) | PGMEA/EL (530) |
| 5 | Polym. 9 (80) | PAG. 1 (1) PAG. 12 (2) | — | Triethanolamine (0.1) 1,8-Diazabicycloundecene (0.05) | ACC. 1 (0.5) | PGMEA/EL (530) |

DGLM: 2-methoxyethyl ether
EIPA: 1-ethoxy-2-propanol
EL/BA: mixture of ethyl lactate (85 wt %) and butyl acetate (15 wt %)
PGMEA: propylene glycol monomethyl ether acetate
PGMEA/EP: mixture of propylene glycol monomethyl ether acetate (90 wt %) and ethyl pyruvate (10 wt %)
PGMEA/CH: mixture of propylene glycol monomethyl ether acetate (90 wt %) and cyclohexanone (10 wt %)
PGMEA/EL: mixture of propylene glycol monomethyl ether acetate (70 wt %) and ethyl lactate (30 wt %)

TABLE 6

| Example | Sensitivity Eop (mJ/cm$^2$) | Resolution ($\mu$m) | Profile | Thermal Stability | Collapse of pattern |
|---|---|---|---|---|---|
| 1 | 22.0 | 0.20 | rectangular | good | no |
| 2 | 26.0 | 0.20 | rectangular | good | no |
| 3 | 29.0 | 0.20 | rectangular | good | no |
| 4 | 30.0 | 0.18 | rectangular | good | no |
| 5 | 35.0 | 0.18 | rectangular | good | no |
| 6 | 25.0 | 0.18 | rectangular | good | no |
| 7 | 18.0 | 0.18 | rectangular | good | no |
| 8 | 31.0 | 0.18 | rectangular | good | no |
| 9 | 27.0 | 0.18 | rectangular | good | no |
| 10 | 24.0 | 0.18 | rectangular | good | no |
| 11 | 20.0 | 0.18 | rectangular | good | no |
| 12 | 23.0 | 0.18 | rectangular | good | no |
| 13 | 23.0 | 0.18 | rectangular | good | no |
| 14 | 20.0 | 0.18 | rectangular | good | no |
| 15 | 23.0 | 0.20 | some positive taper | good | no |
| 16 | 22.0 | 0.20 | some positive taper | good | no |
| 17 | 23.0 | 0.20 | some positive taper | good | no |
| 18 | 23.0 | 0.20 | some positive taper | good | no |
| 19 | 18.0 | 0.18 | rectangular | good | no |
| 20 | 19.0 | 0.18 | rectangular | good | no |
| 21 | 18.0 | 0.18 | rectangular | good | no |
| 22 | 20.0 | 0.18 | rectangular | good | no |
| 23 | 27.0 | 0.20 | rectangular | good | no |
| 24 | 29.0 | 0.20 | rectangular | good | no |
| 25 | 32.0 | 0.20 | rectangular | good | no |
| 26 | 27.0 | 0.18 | rectangular | good | no |
| 27 | 30.0 | 0.20 | rectangular | good | no |
| 28 | 31.0 | 0.20 | rectangular | good | no |
| 29 | 28.0 | 0.20 | rectangular | good | no |

Thermal Stability
Good: No change in pattern shape before and after heating.

TABLE 7

| Comparative Example | Sensitivity Eop (mJ/cm$^2$) | Resolution ($\mu$m) | Profile | Thermal Stability | Collapse of pattern |
|---|---|---|---|---|---|
| 1 | 20.0 | 0.22 | Rectangular/reverse | poor | yes |
| 2 | 25.0 | 0.24 | Rectangular/not | poor | yes |
| 3 | 21.0 | 0.22 | Rectangular/T-top | poor | yes |
| 4 | 24.0 | 0.20 | Rectangular/reverse | good | yes |
| 5 | 30.0 | 0.18 | Rectangular/reverse | good | yes |

Thermal Stability
Good: No change in pattern shape before and after heating.
Poor: Deterioration in pattern shape due to sagging after heating.

Next, 0.05% by weight, based on the overall composition, of the acetylene alcohol derivative Olfin E1004 (manufactured by Nisshin Chemical Industry K.K.) having the structural formula shown below was added to the resist compositions of Examples 21, 22, 23, and 24. The resulting resist compositions were examined for shelf stability, as determined based on the increase in particles (foreign matter). In an accelerated test involving storage at 40° C., the number of particles having a size of more than 0.3 μm in liquid was determined using a particle counter KL-20A (Rion K.K.) for counting particles in a liquid. The results are shown in Table 8.

Olfin E1004:

TABLE 8

(CH₂CH₂O)ₘ'—H structure, m' + n' = 3.5

| Example | Just after filtration (particles/ml) | After 4 months - Olfin not added (particles/ml) | After 4 months - Olfin added (particles/ml) |
|---------|---|---|---|
| 21 | 5 | 31 | 1 |
| 22 | 7 | 35 | 7 |
| 23 | 7 | 25 | 12 |
| 24 | 6 | 27 | 9 |

Japanese Patent Application No. 291681/1997 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising:
   (A) an organic solvent;
   (B) at least two polymers which contain at least one type of acid labile group, are crosslinked within a molecule and/or between molecules with crosslinking groups having C—O—C linkages, and have weight average molecular weights of 1,000 to 500,000; and
   (C) a photoacid generator.

2. The resist composition of claim 1, wherein the at least two polymers of component (B) differ with respect to weight average molecular weight, acid labile group content, crosslinking group content, type of acid labile group, or type of crosslinking group.

3. The resist composition of claim 1, further comprising (D) a basic compound.

4. The resist composition of claim 3, wherein component (D) is an aliphatic amine.

5. The resist composition of claim 1, further comprising (E) an aromatic compound having a ≡C—COOH group within the molecule.

6. The resist composition of claim 1, wherein the at least two polymers of component (B) are selected from among polymers which contain recurring units of general formula (1) below and have weight average molecular weights of 1,000 to 500,000

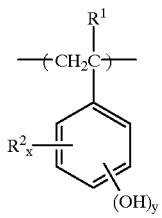

wherein $R^1$ is hydrogen or methyl; $R^2$ is a straight, branched, or cyclic alkyl of 1 to 8 carbon atoms; and x is 0 or a positive integer and y is a positive integer, satisfying $x+y \leq 5$;

in which the hydrogen atoms on some of the phenolic hydroxyl groups have been substituted with at least one type of acid labile group;

which are crosslinked within a molecule and/or between molecules with crosslinking groups having C—O—C linkages resulting from the reaction of some of the remaining phenolic hydroxyl groups with an alkenyl ether compound or a halogenated alkyl ether compound; and in which the combined amount of said acid labile groups and crosslinking groups averages more than 0 mol %, but not more than 80 mol %, of all the phenolic hydroxyl group hydrogens in formula (1).

7. The resist composition of claim 6, wherein the at least two polymers of component (B) are selected from among polymers which contain recurring units of general formula (2) below and have weight average molecular weights of 1,000 to 500,000

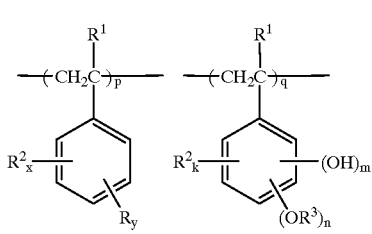

wherein R represents a hydroxyl group or an $OR^3$ group, at least one of the R groups being hydroxyl; $R^1$ is hydrogen or methyl; $R^2$ is a straight, branched, or cyclic alkyl of 1 to 8 carbon atoms; $R^3$ is an acid labile group; x is 0 or a positive integer and y is a positive integer, satisfying $x+y \leq 5$; k is 0 or a positive integer, m is 0 or a positive integer, and n is a positive integer, satisfying $k+m+n \leq 5$; p and q are positive numbers satisfying $p+q=1$; and when n is 2 or more, the $R^3$ groups may be the same or different;

which are crosslinked within a molecule and/or between molecules with crosslinking groups having C—O—C linkages resulting from the reaction of phenolic hydroxyl groups represented by R in formula (2) with an alkenyl ether compound or a halogenated alkyl ether compound; and in which the combined amount of said acid labile groups and crosslinking groups averages more than 0 mol %, but not more than 80 mol %, of all the phenolic hydroxyl group hydrogens in formula (1).

8. The resist composition of claim 7, wherein the at least two polymers of component (B) are selected from among polymers which contain recurring units of general formula (3) below and have weight average molecular weights of 1,000 to 500,000;

which are crosslinked within a molecule and/or between molecules by crosslinking groups having C—O—C linkages of general formula (4a) or (4b) below at oxygen atoms left after elimination of hydrogen atoms from the phenolic hydroxyl groups represented by R in formula (3); and in which the combined amount of said acid labile groups and crosslinking groups averages more than 0 mol %, but not more than 80 mol %, of all the phenolic hydroxyl group hydrogens in formula (1)

wherein $R^8$ and $R^9$ are each hydrogen or a straight, branched or cyclic alkyl of 1 to 8 carbon atoms, or $R^8$ and $R^9$ may together form a ring, with the proviso that each of $R^8$ and $R^9$ is a straight or branched alkylene of 1 to 8 carbon atoms when they form a ring; $R^{13}$ is a straight, branched or cyclic alkylene of 1 to 10 carbon atoms; the letter d is 0 or an integer from 1 to 10; A is a c-valent aliphatic or alicyclic saturated hydrocarbon, aromatic hydrocarbon, or heterocyclic group of 1 to 50 carbon atoms which may have an intervening heteroatom, and in which some of the hydrogen atoms attached to the carbon atoms may be substituted with hydroxyl, carboxyl, acyl, or halogen; B is —CO—O—, (3)

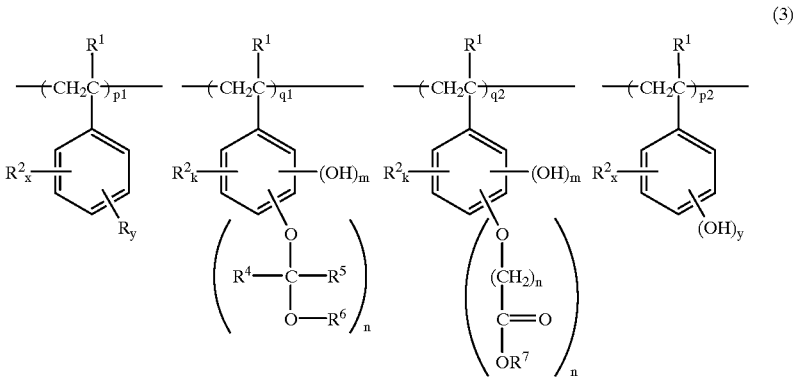

wherein R represents a hydroxyl group or an $OR^3$ group, at least one of the R groups being hydroxyl; $R^1$ is hydrogen or methyl; $R^2$ is a straight, branched, or cyclic alkyl of 1 to 8 carbon atoms; $R^3$ is an acid labile group; $R^4$ and $R^5$ are each hydrogen or a straight, branched, or cyclic alkyl of 1 to 8 carbon atoms; $R^6$ is a monovalent hydrocarbon group of 1 to 18 carbon atoms which may have a heteroatom; $R^4$ and $R^5$, $R^4$ and $R^6$, or $R^5$ and $R^6$ may together form a ring, with the proviso that $R^4$, $R^5$ and $R^6$ are each straight or branched alkylenes of 1 to 18 carbon atoms when they form a ring; $R^7$ is a tertiary alkyl of 4 to 20 carbon atoms, a trialkyl-silyl group in which each of the alkyl constituents has 1 to 6 carbon atoms, an oxoalkyl group of 4 to 20 carbon atoms, or a group of the formula —$CR^4R^5OR^6$; p1 and p2 are positive numbers, and q1 and q2 are 0 or positive numbers, satisfying $0<p1/(p1+q1+q2+p2)\leq0.8$, $0\leq q1/(p1+q1+q2+p2)\leq0.8$, $0\leq q2/(p1+q1+q2+p2)\leq0.8$, and $p1+q1+q2+p2=1$, provided that q1 and q2 are not both 0; the letter a is 0 or a positive integer from 1 to 6; and x, y, k, m and n are each as defined above;

(4a)

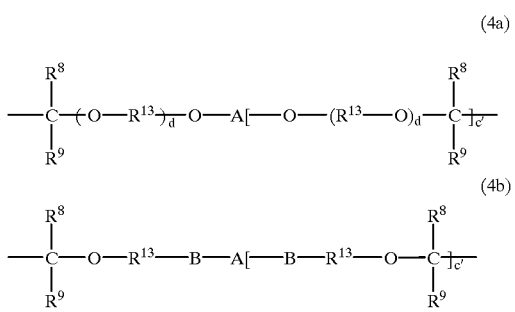

(4b)

—NHCO—O—, or —NHCONH—; c is an integer from 2 to 8; and c' is an integer from 1 to 7.

9. The resist composition of claim 8, wherein the crosslinking groups having C—O—C linkages of general formula (4a) or (4b) are represented by general formula (4a') or (4b') below (4a')

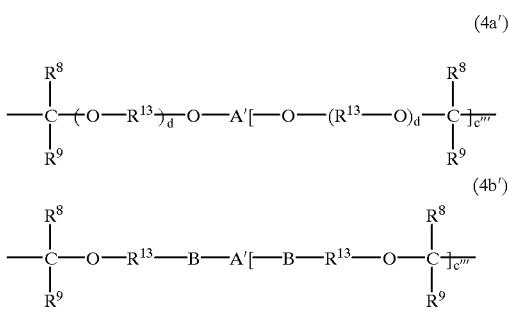

(4b')

wherein $R^8$ and $R^9$ are each hydrogen or a straight, branched or cyclic alkyl of 1 to 8 carbon atoms, or $R^8$ and $R^9$ may together form a ring, with the proviso that each of $R^8$ and $R^9$ is a straight or branched alkylene of 1 to 8 carbon atoms when they form a ring; $R^{13}$ is a straight, branched or cyclic alkylene of 1 to 10 carbon atoms; the letter d is 0 or an integer from 1 to 5; A' is a c"-valent straight, branched, or cyclic alkylene, alkyltriyl, or alkyltetrayl of 1 to 20 carbon atoms, or an arylene of 6 to 30 carbon atoms, which may have an intervening heteroatom, and in which some of the hydrogen atoms attached to the carbon atoms may be substituted with hydroxyl, carboxyl, acyl or halogen; B is —CO—O—, —NHCO—O—, or —NHCONH—; c" is an integer from 2 to 4; and c''' is an integer from 1 to 3.

10. The resist composition of claim 1, wherein component (C) is at least one selected from among onium salts, diazomethane derivatives, glyoxime derivatives, and imidoyl sulfonate derivatives.

11. The resist composition of claim 1, further comprising (F) a base resin other than component (B) which is a partially substituted polymer containing recurring units of general formula (1) below and having a weight average molecular weight of 3,000 to 300,000, wherein an average of at least 0 mol %, but not more than 80 mol %, of all the hydrogen atoms on the phenolic hydroxyl groups have been substituted with at least one type of acid labile group

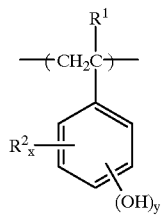

wherein $R^1$ is hydrogen or methyl; $R^2$ is a straight, branched, or cyclic alkyl of 1 to 8 carbon atoms; and x is 0 or a positive integer and y is a positive integer, satisfying $x+y \leq 5$.

12. The resist composition of claim 11, wherein component (F) is a polymer containing recurring units of general formula (10) below and having a weight average molecular weight of 3,000 to 300,000

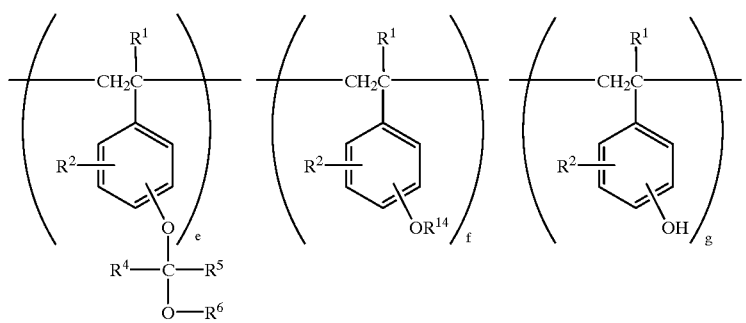

wherein $R^1$, $R^2$, $R^4$, $R^5$, and $R^6$ are as defined above; $R^{14}$ is an acid labile group other than $-CR^4R^5OR^6$; and e and f are each 0 or a positive number, and g is a positive number, satisfying $e+f+g=1$, $0 \leq e/(e+f+g) \leq 0.5$, and $0.4 \leq g/(e+f+g) \leq 0.9$.

13. The resist composition of claim 1, further comprising (G) a dissolution regulator.

14. The resist composition of claim 1, further comprising (H) a UV absorber.

15. The resist composition of claim 1, further comprising (I) an acetylene alcohol derivative.

16. A patterning process comprising the steps of:
(i) applying the resist composition of claim 1 onto a substrate;
(ii) heat treating the applied resist composition, then exposing it through a photomask to high-energy radiation having a wavelength not greater than 300 nm or an electron beam; and
(iii) heat treating the exposed resist composition if necessary, then developing it with a developer.

17. A resist composition as claimed in claim 1, wherein the amount of the polymers with crosslinking groups having C—O—C linkages is from 0.2 to 20 mol %.

18. A resist composition as claimed in claim 1, wherein the amount of the polymers having acid labile groups is from 10 to 50 mol %.

19. A resist composition as claimed in claim 1, wherein the composition comprises polymers having a weight average molecular weight of from 3,000 to 50,000.

* * * * *